US008829765B2

(12) United States Patent
Tang

(10) Patent No.: US 8,829,765 B2
(45) Date of Patent: Sep. 9, 2014

(54) PIEZOELECTRIC ACTUATOR DEVICE

(75) Inventor: Min Tang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 493 days.

(21) Appl. No.: 13/289,792

(22) Filed: Nov. 4, 2011

(65) Prior Publication Data

US 2012/0112606 A1    May 10, 2012

(30) Foreign Application Priority Data

Nov. 4, 2010   (SG) .............................. 201008130-5

(51) Int. Cl.
*H01L 41/053*   (2006.01)
*H01L 41/09*    (2006.01)

(52) U.S. Cl.
USPC ............ 310/330; 310/331; 310/332; 310/348

(58) Field of Classification Search
USPC ........... 310/328, 330–332, 348; 977/724, 732
See application file for complete search history.

(56) References Cited

U.S. PATENT DOCUMENTS

| | | | |
|---|---|---|---|
| 3,513,356 A * | 5/1970 | Newell ........................... | 257/418 |
| 7,446,457 B2 | 11/2008 | Ikehashi | |
| 7,619,349 B2 | 11/2009 | Kawakubo et al. | |
| 2003/0223174 A1 * | 12/2003 | Prophet .......................... | 361/115 |
| 2005/0253487 A1 * | 11/2005 | Allan et al. .................... | 310/331 |
| 2006/0055287 A1 | 3/2006 | Kawakubo et al. | |
| 2009/0296308 A1 | 12/2009 | Kawakubo et al. | |
| 2011/0260580 A1 * | 10/2011 | Blume et al. ............. | 310/323.02 |

OTHER PUBLICATIONS

H. Fang, et al., Modeling and Design Optimization of Large-Deflection Piezoelectric Folded Cantilever Microactuators, IEEE Trans. Ultrasonics, Ferroelectrics, and Frequency Control, vol. 53, No. 1, pp. 237-240, Jan. 2006.

* cited by examiner

*Primary Examiner* — Thomas Dougherty
(74) *Attorney, Agent, or Firm* — K. David Crockett, Esq.; Crockett & Crockett, PC

(57) ABSTRACT

A piezoelectric actuator device includes a substrate anchor region; a support beam arrangement having first and second ends, wherein the first end is fixed to the anchor region and the second end is freely suspended; first and second beams having first and second ends, wherein the first end of each beam is mechanically fixed to at least a part of the second end of the support beam arrangement and the second end of each beam is freely suspended; a coupling beam mechanically coupling the second end of the first and second beams; wherein the first and second beams are arranged such that the first end of the support beam arrangement is located between the coupling beam and the second end of the support beam arrangement.

15 Claims, 19 Drawing Sheets

PIEZOELECTRIC ACTUATOR DEVICE

CROSS-REFERENCE TO RELATED APPLICATION

This application claims the benefit of priority of Singapore Patent Application No. 201008130-5, filed 4 Nov. 2010, the contents of which being hereby incorporated by reference in its entirety for all purposes.

TECHNICAL FIELD

Various embodiments relate generally to a piezoelectric actuator device.

BACKGROUND

A piezoelectric actuator, which uses an inverse piezoelectric effect or an electrostrictive effect as a driven force, generally has advantages of low actuation voltage and large displacement. These advantages of the piezoelectric actuator can be attractive for microelectromechanical system (MEMS) devices, such as MEMS switches and capacitors.

However, a conventional cantilever beam actuator, which has a long thin beam structure including a piezoelectric film interposed between upper and lower electrodes, usually curls upward or downward by slight residual stress of multiple layers of thin films. However, this may result in disparity of the driving voltage to the design value, and may even lead to failure of the device.

SUMMARY

According to one embodiment, a piezoelectric actuator device is provided. The piezoelectric actuator device includes a substrate including an anchor region; a support beam arrangement having a first end and a second end, wherein the first end is mechanically fixed to the anchor region, the support beam arrangement extends from its first end to its second end and the second end is freely suspended; a first beam having a first end and a second end, wherein the first end of the first beam is mechanically fixed to at least a part of the second end of the support beam arrangement and the second end of the first beam is freely suspended; a second beam having a first end and a second end, wherein the first end of the second beam is mechanically fixed to at least a part of the second end of the support beam arrangement and the second end of the second beam is freely suspended; a coupling beam mechanically coupling the second end of the first beam and the second end of the second beam; wherein the first beam and the second beam are arranged such that the first end of the support beam arrangement is located between the coupling beam and the second end of the support beam arrangement.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a piezoelectric actuator device will be described in detail below with reference to the accompanying figures. It will be appreciated that the embodiments described below can be modified in various aspects without changing the essence of the invention.

Figure 1:
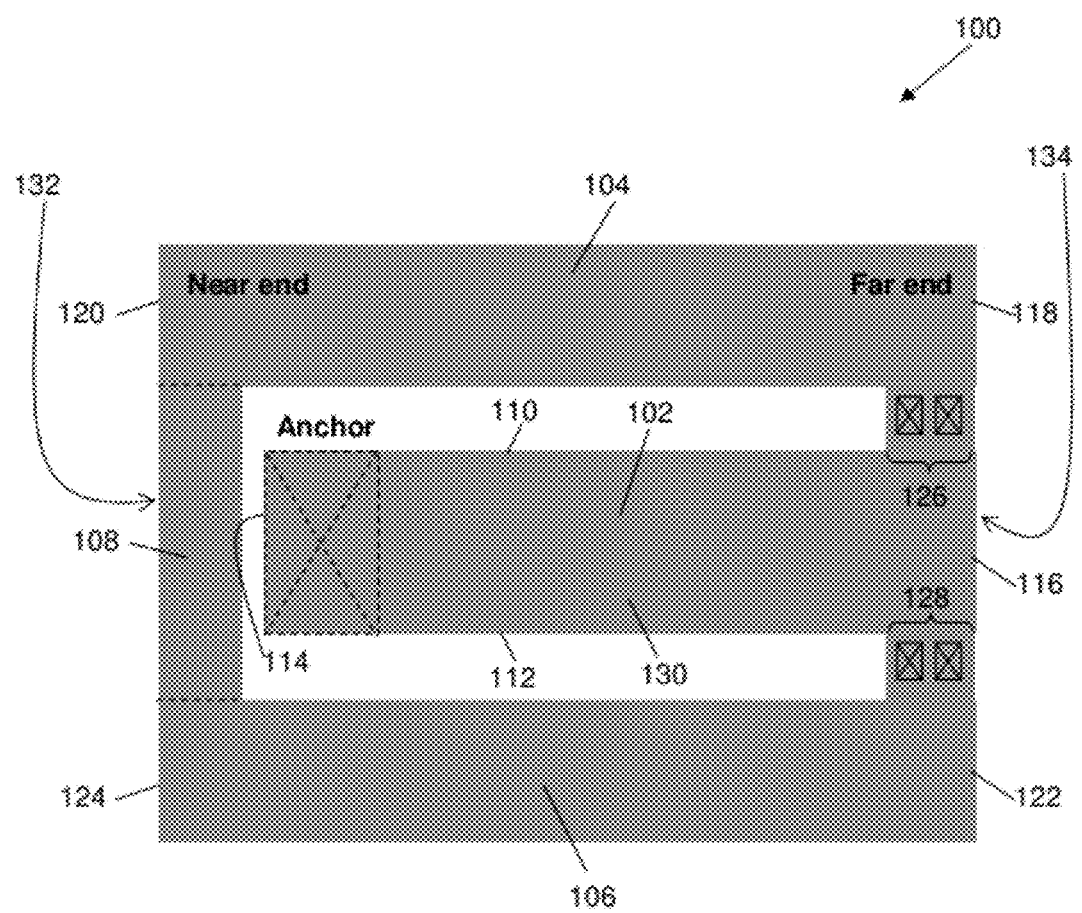
FIG. 1 shows a schematic top view of a piezoelectric actuator device according to one embodiment.

FIG. 1 shows a schematic top view of a piezoelectric actuator device 100. The piezoelectric actuator device 100 includes a support beam arrangement 102, a first beam 104, a second beam 106 and a coupling beam 108. The first beam 104 and the second beam 106 are arranged at opposite sides of the support beam arrangement 102. That is, the first beam 104 is arranged adjacent a first side 110 of the support beam arrangement 102, and the second beam 106 is arranged adjacent a second side 112 of the support beam arrangement 102.

The support beam arrangement 102 has a first end 114 and a second end 116. The support beam arrangement 106 extends from its first end 114 to its second end 116. The first beam 104 has a first end 118 and a second end 120. The second beam 106 has a first end 122 and a second end 124.

The second end 116 of the support beam arrangement 102 may be freely suspended before the first end 118 of the first beam 104 and the first end 122 of the second beam 106 are mechanically fixed to at least a part of the second end 116 of the support beam arrangement 102 respectively. The first end 118 of the first beam 104 may be mechanically fixed a part 126 of the second end 116 of the support beam arrangement 102. The first end 122 of the second beam 106 may be mechanically fixed a part 128 of the second end 116 of the support beam arrangement 102. In short, the second end 116 of the support beam arrangement 102, the first end 118 of the first beam 104 and the first end 122 of the second beam 106 are fixed or connected together.

The second end 120 of the first beam 104 and the second end 124 of the second beam 106 may be freely suspended before the coupling beam 108 is mechanically coupled to the second end 120 of the first beam 104 and the second end 124 of the second beam 106. The first beam 104 and the second beam 106 are arranged such that the first end 114 of the support beam arrangement 102 is located between the coupling beam 108 and the second end 116 of the support beam arrangement 102.

Figure 2:
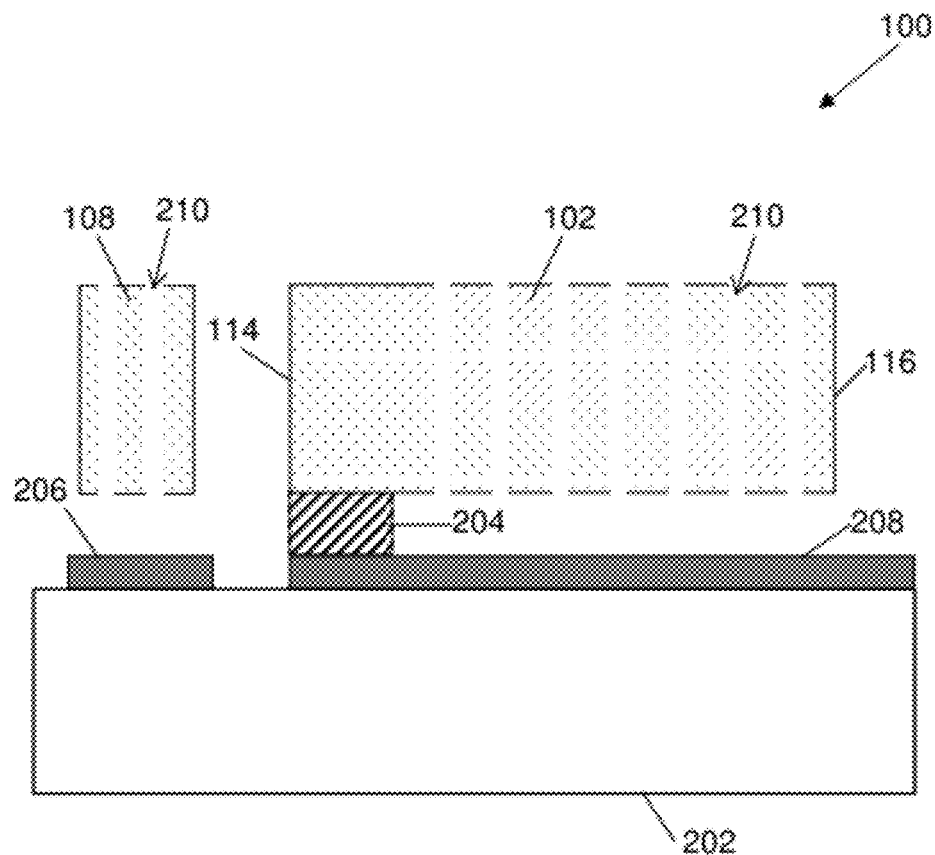
FIG. 2 shows a schematic cross-sectional view of a piezoelectric actuator device according to one embodiment.

The piezoelectric actuator device 100 also includes a substrate 202 having an anchor region 204 as shown in FIG. 2. The first end 114 of the support beam arrangement 102 is mechanically fixed to the anchor region 204. In one embodiment, the substrate 202 may include a bottom electrode 206 arranged below at least one of the second end 120 of the first beam 104 and the second end 124 of the second beam 106. The bottom electrode 206 may be a contact portion disposed on the substrate 202. The contact portion may be disposed adjacent the anchor region 204 to reduce initial deformation of the piezoelectric actuator device 100. The substrate 202 may also include a bias line 208. Further, the support beam arrangement 102, the first beam 104, the second beam 106 and the coupling beam 108 have release holes 210 for release purpose. The release holes 210 may be formed in the support beam arrangement 102, the first beam 104, the second beam 106 and the coupling beam 108 in a form of through-holes. The release holes 210 may be used to reduce the release time during the release process, i.e., removal of sacrificial layer under the support beam arrangement 102, the first beam 104, the second beam 106 and the coupling beam 108.

Referring to both FIGS. 1 and 2, the support beam arrangement 102, the first beam 104, and the second beam 106 are arranged such that the second end 120 of the first beam 104 is nearer to the anchor region 204 than the first end 118 of the first beam 104 and such that the second end 124 of the second beam 106 is nearer to the anchor region 204 than the first end 122 of the second beam 106.

In one embodiment, the support beam arrangement 102 may include at least one support beam. The support beam arrangement 102 may include different numbers of support beams in various embodiments. The support beam arrangement 102 shown in FIG. 1 has one support beam 130.

In one embodiment, the piezoelectric actuator device 100 may have one forward beam (e.g. support beam arrangement 102) in the center and two backward beams (e.g. first beam 104 and second beam 106) at the sides. In other words, the piezoelectric actuator device 100 may have a forward beam extending in one direction from the anchor 204 and two backward beams extending in an opposite direction back to the anchor 204. The two backward beams may be arranged at opposite sides of the forward beam. The two backward beams may be connected to the forward beam at one end of the forward beam which is opposite to the end of the forward beam attached to the anchor 204. The two backward beams may be connected to each other in the vicinity of the anchor 204 (e.g. via the coupling beam 108). One end 132 of the piezoelectric actuator device 100, which includes the second end 120 of the first beam 104, the coupling beam 108 and the second end 124 of the second beam 106, is referred as a near end. The near end 132 can be used as an actuation part or action end of the piezoelectric actuator device 100. Another end 134 of the piezoelectric actuator device 100, which includes the second end 116 of the support beam arrangement 102, the first end 118 of the first beam 104 and the first end 122 of the second beam 106, is referred as a far end.

Figure 3:
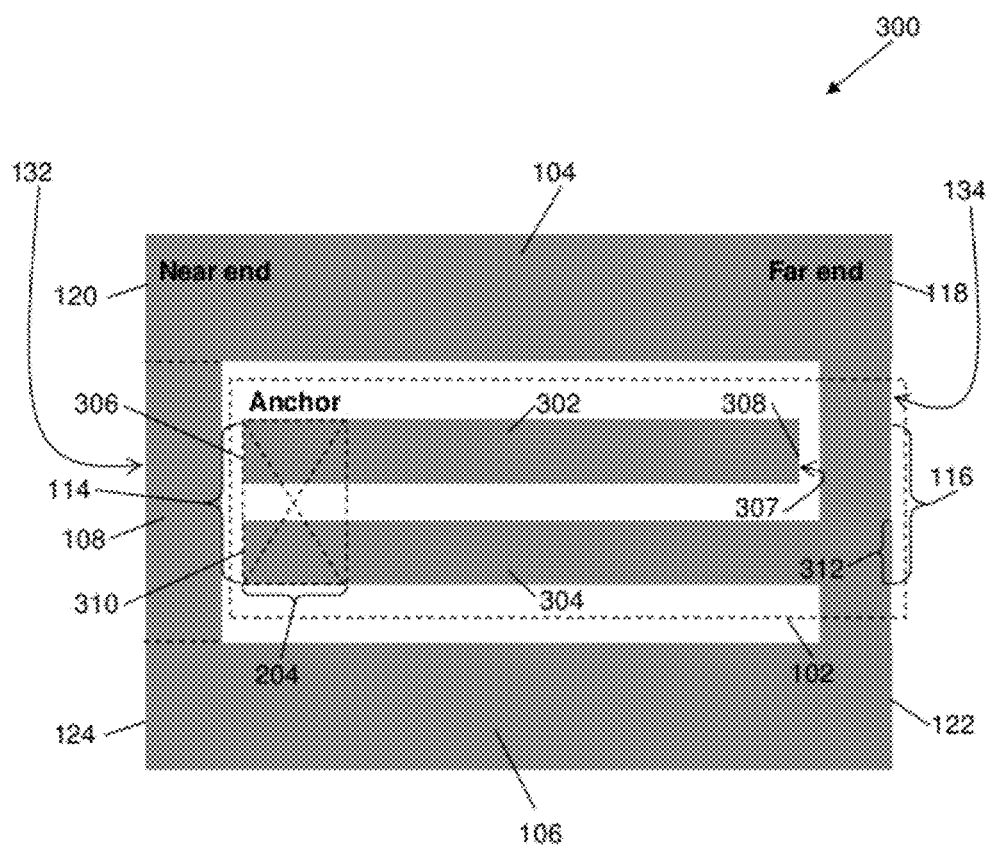
FIG. 3 shows a schematic top view of a piezoelectric actuator device according to one embodiment.

FIG. 3 shows a schematic top view of a piezoelectric actuator device 300 having the support beam arrangement 102 which has two support beam elements, e.g. a first support beam element 302 and a second support beam element 304. The first support beam element 302 has a first end 306 and a second end 308. The first end 306 of the first support beam element 302 may correspond to the first end 114 of the support beam arrangement 102. The second end 308 of the first support beam element 302 may terminate at a point 307 near to the second end 116 of the support beam arrangement 102. The first support beam element 302 may extend from its first end 306 to its second end 308. In other words, the first support beam element 302 may extend from the first end 114 of the support beam arrangement 102 to the point 307 near the second end 116 of the support beam arrangement 102.

The second support beam element 304 has a first end 310 and a second end 312. The first end 310 of the second support beam element 304 may correspond to the first end 114 of the support beam arrangement 102. The second end 312 of the second support beam element 304 may correspond to the second end 116 of the support beam arrangement 102. The second support beam element 304 may extend from its first end 310 to its second end 312. In other words, the second support beam element 304 extends from the first end 114 of the support beam arrangement 102 to the second end 116 of the support beam arrangement 102.

The first end 306 of the first support beam element 302 and the first end 310 of the second support beam element 304 may be mechanically fixed to the anchor region 204.

The first support beam element 302 and the second support beam element 304 are each electrically conductive. However, the first support beam element 302 and the second support beam element 304 are electrically isolated from each other.

The first beam 104 may be disposed adjacent the first support beam element 302 of the support beam arrangement 102. The second beam 106 may be disposed adjacent the second support beam element 304 of the support beam arrangement 102. The first beam 104 and the second beam 106 may be mechanically fixed to the second support beam element 304.

The piezoelectric actuator device 300 as shown in FIG. 3 may have a one-level driving configuration. The piezoelectric actuator device 100 as shown in FIG. 1 may have a second-level driving configuration as shown in FIG. 1. For one-level driving, only the first beam 104 and the second beam 106 are applied with a bias voltage, causing them to move upwards or downwards. No bias voltage is applied to the support beam arrangement beam 102. Therefore, there is no displacement for the support beam arrangement beam 102. For second-level driving, the support beam arrangement beam 102, the first beam 104 and the second beam 106 are applied with a bias voltage. The potential polarity of the support beam arrangement beam 102 and the potential polarity of both the first beam 104 and the second beam 106 are opposite. In other words, the polarity of the bias voltage applied on the support beam arrangement beam 102 and the polarity of the bias voltage applied on both the first beam 104 and the second beam 106 are opposite. Therefore, the support beam arrangement beam 102, the first beam 104 and the second beam 106 contribute to the displacement of the piezoelectric actuator device 100.

The piezoelectric actuator device 100 having a one-level driving configuration as shown in FIG. 3 has the support beam arrangement 102 being split into two support beam elements 302, 304 for easy application of the bias voltage. As such, no vias are needed for potential transition.

In one embodiment, the piezoelectric actuator device 100 may have a mono-morph structure, a bimorph structure or a multi-morph structure. The piezoelectric actuator device 100 may include at least one piezoelectric layer. In other words, each of the support beam arrangement 102, the first beam 104, and the second beam 106 may include at least one piezoelectric layer. The piezoelectric actuator device 100 may include at least a first electrode layer and a second electrode layer. In other words, each of the support beam arrangement 102, the first beam 104, and the second beam 106 may include at least a first electrode layer and a second electrode layer. The at least one piezoelectric layer may be arranged between the first electrode layer and the second electrode layer. Depending on the structure of the piezoelectric actuator device 100, the numbers of the piezoelectric layer, the first electrode layer and the second electrode layer of the piezoelectric actuator device 100 (i.e. each of the support beam arrangement 102, the first beam 104, and the second beam 106) may vary.

Figure 4A:
FIG. 4 shows schematic diagrams of different structures of a piezoelectric actuator device according to one embodiment.

For the piezoelectric actuator device 100 having a mono-morph structure, each of the support beam arrangement 102, the first beam 104, and the second beam 106 has a first electrode layer 402, a second electrode layer 404 and a piezoelectric layer 406 as shown in FIG. 4a. The piezoelectric layer 406 is arranged between the first electrode layer 402 and the second electrode layer 404.

Various materials may be used for the first electrode layer 402, the second electrode layer 404 and the piezoelectric layer 406. In one embodiment, the first electrode layer 402 and the second electrode layer 404 may include aluminium (Al). The piezoelectric layer 406 may include aluminium nitride (AlN). Thus, the piezoelectric actuator device 100 may have a mono-morph structure of e.g. Al/AlN/Al.

Figure 4B:
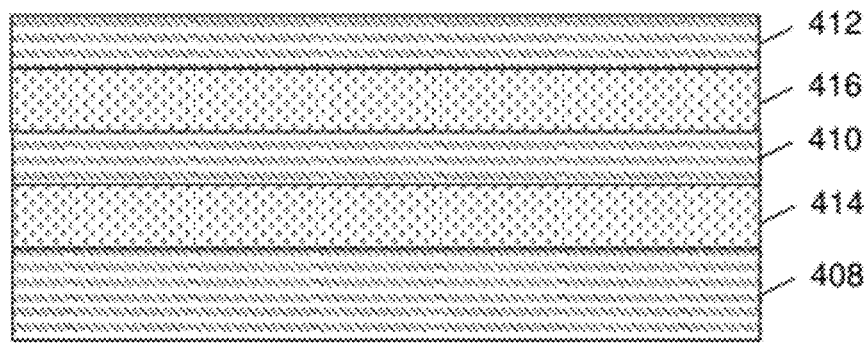
Figure 4C:
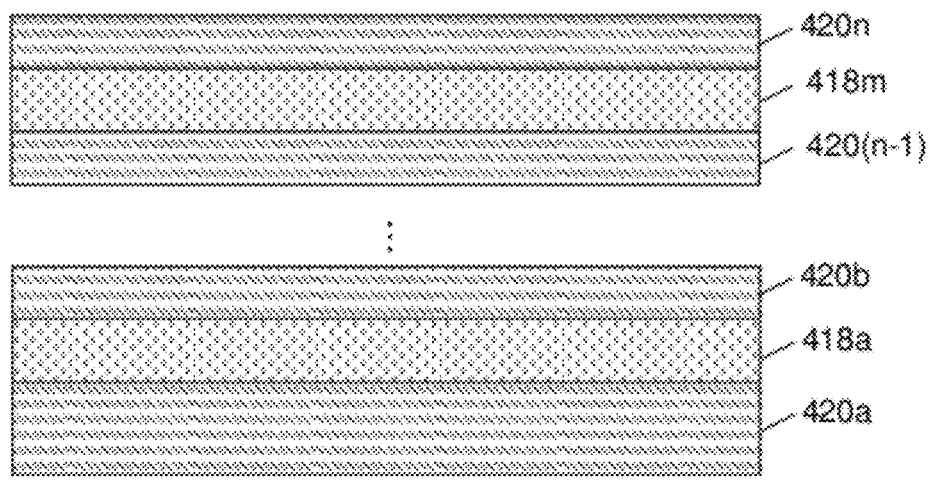

For the piezoelectric actuator device 100 having a bimorph structure, each of the support beam arrangement 102, the first beam 104, and the second beam 106 has a first electrode layer 408, a second electrode layer 410, a third electrode layer 412, a first piezoelectric layer 414 and a second piezoelectric layer 416 as shown in FIG. 4b. The first piezoelectric layer 414 is arranged between the first electrode layer 408 and the second electrode layer 410. The second piezoelectric layer 416 is arranged between the second electrode layer 410 and the third electrode layer 412.

Various materials may be used for the first electrode layer 408, the second electrode layer 410, the third electrode layer 412, the first piezoelectric layer 414 and the second piezoelectric layer 416. In one embodiment, the first electrode layer 408, the second electrode layer 410 and the third electrode layer 412 may include aluminium (Al). The first piezoelectric layer 414 and the second piezoelectric layer 416 may include aluminium nitride (AlN). Thus, the piezoelectric actuator device 100 may have a bimorph structure of e.g. Al/AlN/Al/AlN/Al.

For the piezoelectric actuator device 100 having a multi-morph structure, each of the support beam arrangement 102, the first beam 104, and the second beam 106 includes a plurality of piezoelectric layers (418a, 418b, ..., 418m) and a multiplicity of electrode layers (420a, 420b, ..., 420n), where m represents the number of piezoelectric layers and n represents the number of electrode layers. The plurality of piezoelectric layers (418a, 418b, ..., 418m) and the multiplicity of electrode layers (420a, 420b, ..., 420n) are arranged such that each piezoelectric layer (418a, 418b, ..., 418m) is surrounded by two electrode layers (420a, 420b, ..., 420n). Each piezoelectric layer (418a, 418b, ..., 418m) is disposed between two electrode layers (420a, 420b, ..., 420n).

Figure 5:
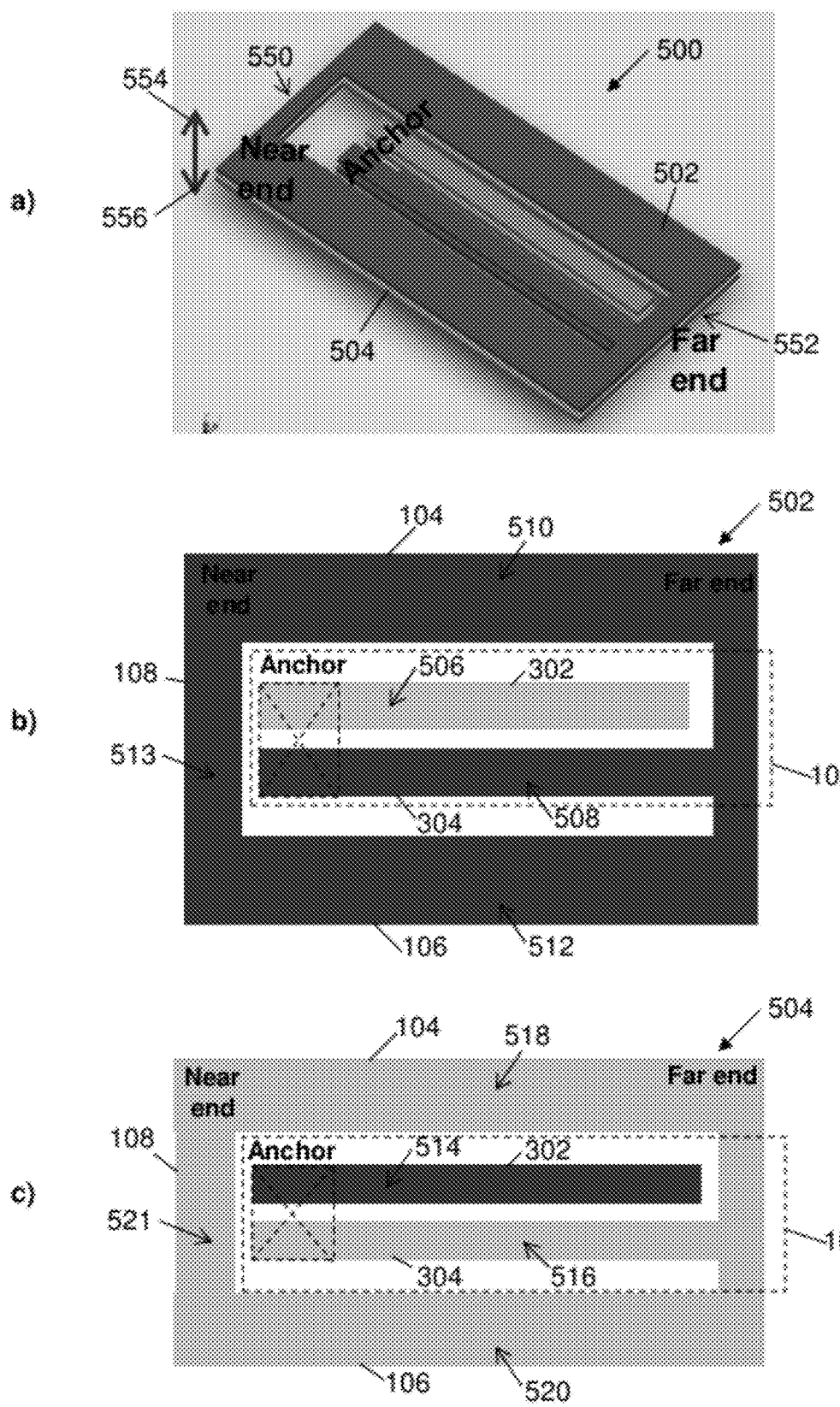
FIG. 5 shows schematic diagrams of a piezoelectric actuator device having a mono-morph structure and one-level driving configuration according to one embodiment.

FIG. 5a shows a schematic three-dimensional view of a piezoelectric actuator device 500 having a one-level driving configuration and a mono-morph structure. The piezoelectric actuator device 500 has a first electrode layer 502 and a second electrode layer 504. The piezoelectric actuator device 500 also has a piezoelectric layer disposed between the first electrode layer 502 and the second electrode layer 504. For simplicity, the piezoelectric layer is not shown in FIG. 5a. The first electrode layer 502 and the second electrode layer 504 may be electrically isolated from each other.

The piezoelectric actuator device 500 has a near end 550 and a far end 552. Arrows 554, 556 indicate driving directions of the piezoelectric actuator device 500.

FIG. 5b shows a schematic top view of the first electrode layer 502 of the piezoelectric actuator device 500. FIG. 5c shows a schematic bottom view of the second electrode layer 504 of the piezoelectric actuator device 500. The first electrode layer 502 of the piezoelectric actuator device 500 may include a first electrode layer 506 of the first support beam element 302 of the support beam arrangement 102, a first electrode layer 508 of the second support beam element 304 of the support beam arrangement 102, a first electrode layer 510 of the first beam 104 and a first electrode layer 512 of the second beam 106. The first electrode layer 502 of the piezoelectric actuator device 500 may also include a first electrode layer 513 of the coupling beam 108. The second electrode layer 504 of the piezoelectric actuator device 500 may include a second electrode layer 514 of the first support beam element 302 of the support beam arrangement 102, a second electrode layer 516 of the second support beam element 304 of the support beam arrangement 102, a second electrode layer 518 of the first beam 104 and a second electrode layer 520 of the second beam 106. The second electrode layer 504 of the piezoelectric actuator device 500 may also include a second electrode layer 521 of the coupling beam 108.

The first electrode layer 508 of the second support beam element 304, the first electrode layer 510 of the first beam 104, the first electrode layer 512 of the second beam 106 and the first electrode layer 513 of the coupling beam 108 are electrically connected. The first electrode layer 508 of the second support beam element 304, the first electrode layer 510 of the first beam 104, the first electrode layer 512 of the second beam 106 and the first electrode layer 513 of the coupling beam 108 are isolated from the first electrode layer 506 of the first support beam element 302. The second electrode layer 516 of the second support beam element 304, the second electrode layer 518 of the first beam 104, the second electrode layer 520 of the second beam 106 and the second electrode layer 521 of the coupling beam 108 are electrically connected. The second electrode layer 516 of the second support beam element 304, the second electrode layer 518 of the first beam 104, the second electrode layer 520 of the second beam 106 and the second electrode layer 521 of the coupling beam 108 are isolated from the second electrode layer 514 of the first support beam element 302.

In one embodiment, a bias voltage may be applied on the first electrode layer 508 of the second support beam element 304, the first electrode layer 510 of the first beam 104, the first electrode layer 512 of the second beam 106 and the first electrode layer 513 of the coupling beam 108 while the first electrode layer 506 of the first support beam element 302 may be grounded. A bias voltage may be applied on the second electrode layer 514 of the first support beam element 302 while the second electrode layer 516 of the second support beam element 304, the second electrode layer 518 of the first beam 104, the second electrode layer 520 of the second beam 106 and the second electrode layer 521 of the coupling beam 108 may be grounded.

In another embodiment, a bias voltage may be applied on the first electrode layer 506 of the first support beam element 302 while the first electrode layer 508 of the second support beam element 304, the first electrode layer 510 of the first beam 104, the first electrode layer 512 of the second beam 106 and the first electrode layer 513 of the coupling beam 108 may be grounded. A bias voltage may be applied on the second electrode layer 516 of the second support beam element 304, the second electrode layer 518 of the first beam 104, the second electrode layer 520 of the second beam 106 and the second electrode layer 521 of the coupling beam 108 while the second electrode layer 514 of the first support beam element 302 may be grounded.

Therefore, the first electrode layers 506, 508, 510, 512, 513 of the first support beam element 302, the second support beam element 304, the first beam 104, the second beam 106 and the coupling beam 108, and the second electrode layers 514, 516, 518, 520, 521 of the first support beam element 302, the second support beam element 304, the first beam 104, the second beam 106 and the coupling beam 108 may have opposite bias voltage polarity respectively.

Figure 6:
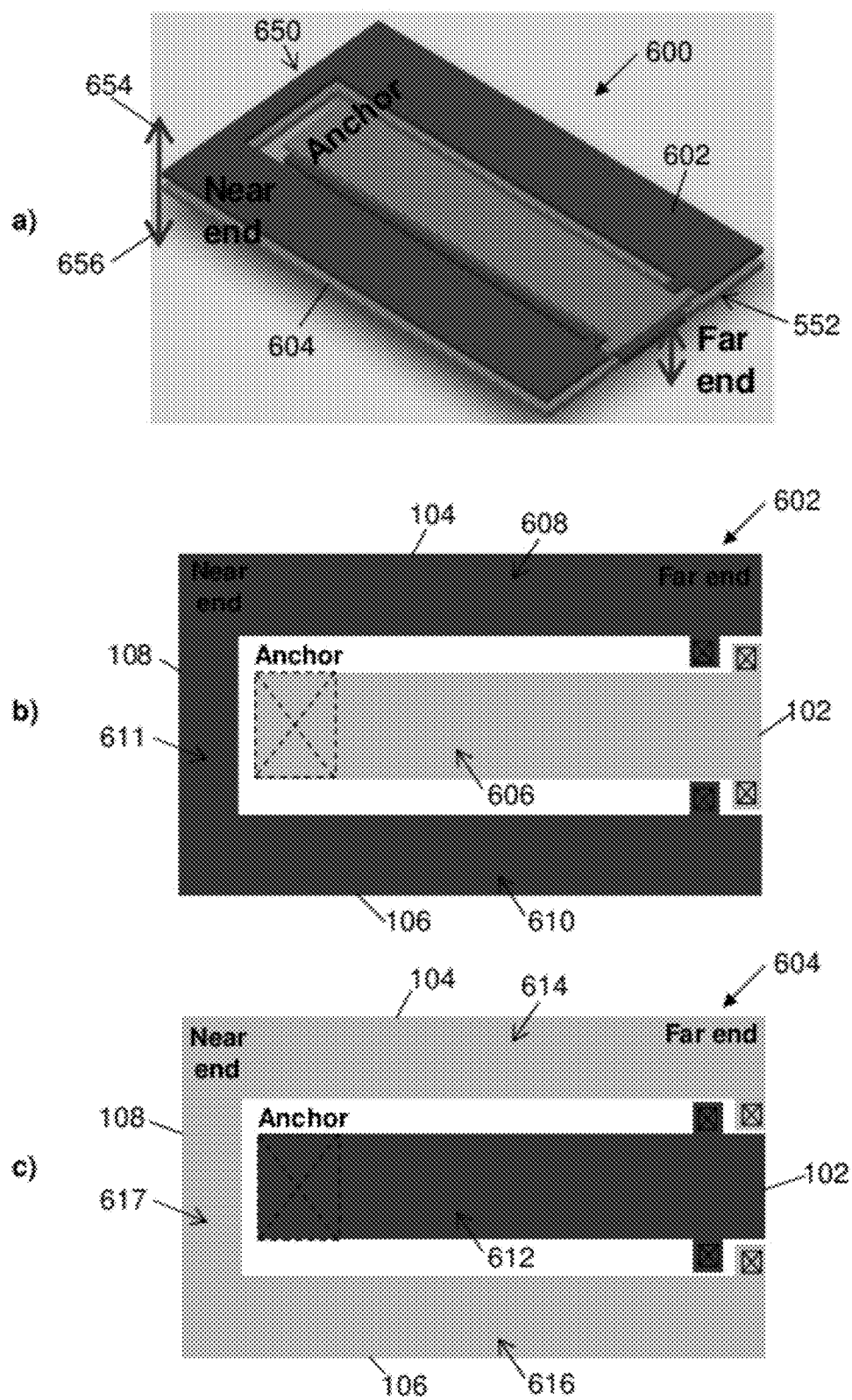
FIG. 6 shows schematic diagrams of a piezoelectric actuator device having a mono-morph structure and two-level driving configuration according to one embodiment.

FIG. 6a shows a schematic three-dimensional view of a piezoelectric actuator device 600 having a two-level driving configuration and a mono-morph structure. The piezoelectric actuator device 600 has a first electrode layer 602 and a second electrode layer 604. The piezoelectric actuator device 600 also has a piezoelectric layer disposed between the first electrode layer 602 and the second electrode layer 604. For simplicity, the piezoelectric layer is not shown in FIG. 6a. The first electrode layer 602 and the second electrode layer 604 may be electrically isolated from each other.

The piezoelectric actuator device 600 has a near end 650 and a far end 652. Arrows 654, 656 indicate driving directions of the piezoelectric actuator device 600.

FIG. 6b shows a schematic top view of a first electrode layer 602 of the piezoelectric actuator device 600. FIG. 6c shows a schematic bottom view of a second electrode layer 604 of the piezoelectric actuator device 600. The first electrode layer 602 of the piezoelectric actuator device 600 may include a first electrode layer 606 of the support beam arrangement 102, a first electrode layer 608 of the first beam 104 and a first electrode layer 610 of the second beam 106. The first electrode layer 602 of the piezoelectric actuator device 600 may also include a first electrode layer 611 of the coupling beam 108. The second electrode layer 604 of the piezoelectric actuator device 600 may include a second electrode layer 612 of the support beam arrangement 102, a second electrode layer 614 of the first beam 104 and a second electrode layer 616 of the second beam 106. The second electrode layer 604 of the piezoelectric actuator device 600 may also include a second electrode layer 617 of the coupling beam 108.

The first electrode layer 608 of the first beam 104, the first electrode layer 610 of the second beam 106 and the first electrode layer 611 of the coupling beam 108 are electrically connected. The first electrode layer 608 of the first beam 104, the first electrode layer 610 of the second beam 106 and the first electrode layer 611 of the coupling beam 108 are isolated from the first electrode layer 606 of the support beam arrangement 102. The second electrode layer 614 of the first beam 104, the second electrode layer 616 of the second beam 106 and the second electrode layer 617 of the coupling beam 108 are electrically connected. The second electrode layer 614 of the first beam 104, the second electrode layer 616 of the second beam 106 and the second electrode layer 617 of the coupling beam 108 are isolated from the second electrode layer 612 of the support beam arrangement 102.

In one embodiment, a bias voltage may be applied on the first electrode layer 608 of the first beam 104, the first electrode layer 610 of the second beam 106 and the first electrode layer 611 of the coupling beam 108 while the first electrode layer 606 of the support beam arrangement 102 may be grounded. A bias voltage may be applied on the second electrode layer 612 of the support beam arrangement 102 while the second electrode layer 614 of the first beam 104, the second electrode layer 616 of the second beam 106 and the second electrode layer 617 of the coupling beam 108 may be grounded.

In another embodiment, a bias voltage may be applied on the first electrode layer 606 of the support beam arrangement 102 while the first electrode layer 608 of the first beam 104, the first electrode layer 610 of the second beam 106 and the first electrode layer 611 of the coupling beam 108 may be grounded. A bias voltage may be applied on the second electrode layer 614 of the first beam 104, the second electrode layer 616 of the second beam 106 and the second electrode layer 617 of the coupling beam 108 while the second electrode layer 612 of the support beam arrangement 102 may be grounded.

Therefore, the first electrode layers 606, 608, 610, 611 of the support beam arrangement 102, the first beam 104, the second beam 106 and the coupling beam 108, and the second electrode layers 612, 614, 616, 617 of the support beam arrangement 102, the first beam 104, the second beam 106 and the coupling beam 108 may have opposite bias voltage polarity respectively.

Figure 7A:
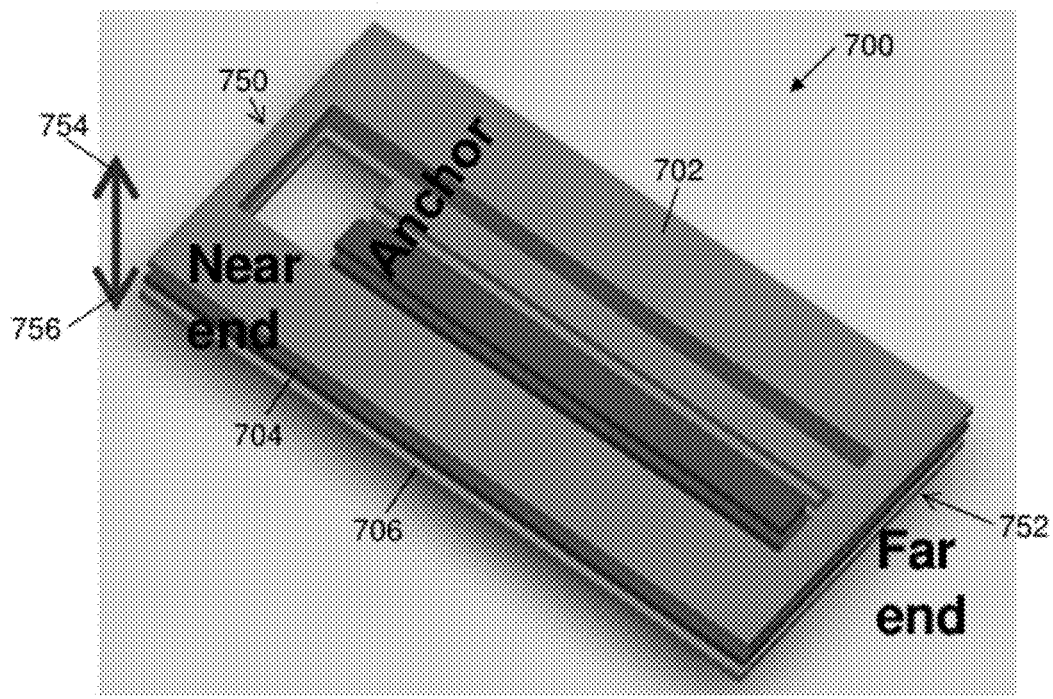
FIG. 7 shows schematic diagrams of a piezoelectric actuator device having a bimorph structure and one-level driving configuration according to one embodiment.
Figure 7:
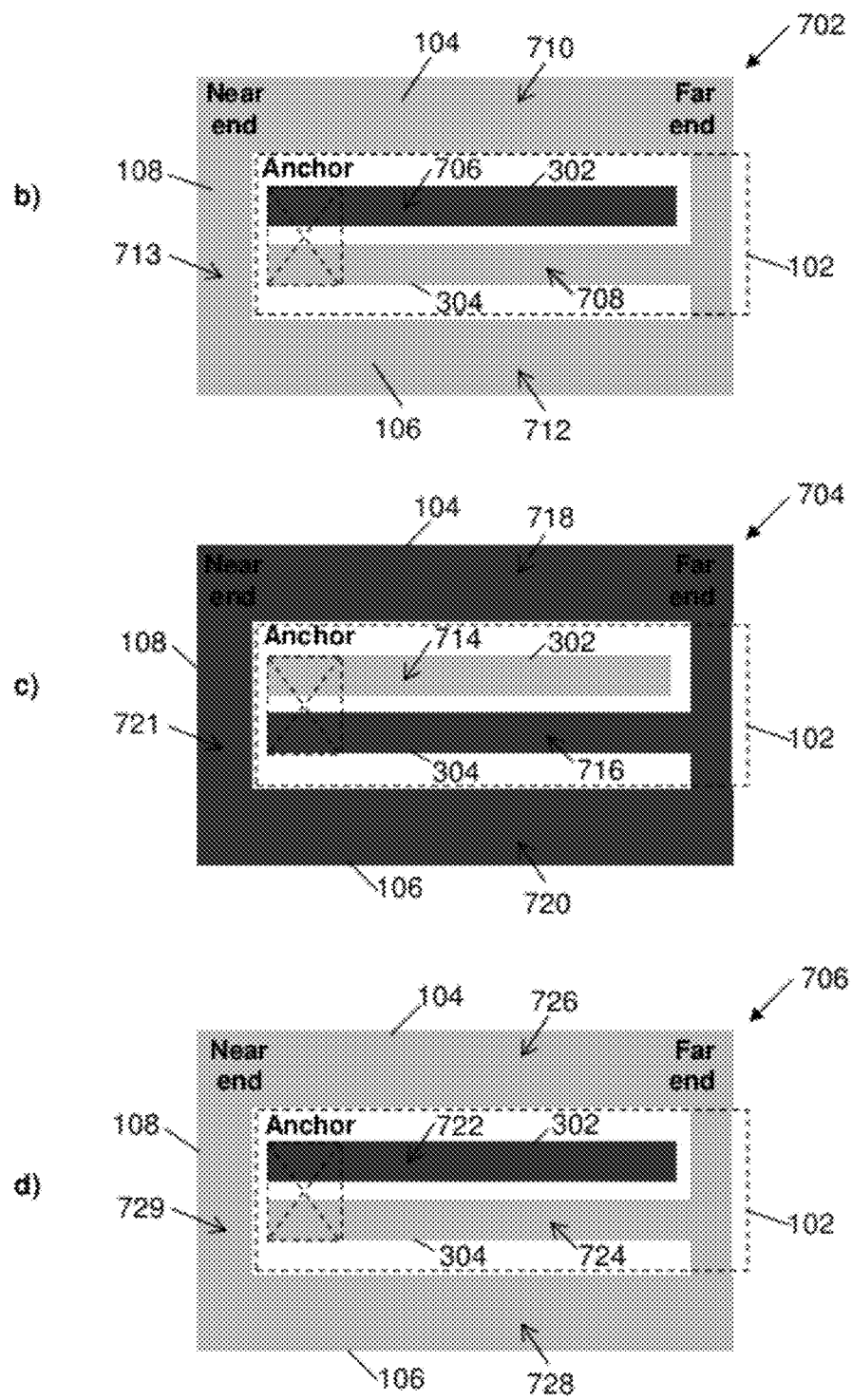

FIG. 7a shows a schematic three-dimensional view of a piezoelectric actuator device 700 having a one-level driving configuration and a bimorph structure. The piezoelectric actuator device 700 has a first electrode layer 702, a second electrode layer 704 and a third electrode layer 706. The piezoelectric actuator device 700 also has a first piezoelectric layer disposed between the first electrode layer 702 and the second electrode layer 704, and a second piezoelectric layer disposed between the second electrode layer 704 and the third electrode layer 706. For simplicity, the first piezoelectric layer and the second piezoelectric layer are not shown in FIG. 7a. The first electrode layer 702, the second electrode layer 704 and the third electrode layer 706 may be electrically isolated from each other.

The piezoelectric actuator device 700 has a near end 750 and a far end 752. Arrows 754, 756 indicate driving directions of the piezoelectric actuator device 700.

FIG. 7b shows a schematic top view of the first electrode layer 702 of the piezoelectric actuator device 700. FIG. 7c shows a schematic top view of the second electrode layer 704 of the piezoelectric actuator device 700. FIG. 7d shows a schematic top view of the third electrode layer 706 of the piezoelectric actuator device 700. The first electrode layer 702 of the piezoelectric actuator device 700 may include a first electrode layer 706 of the first support beam element 302 of the support beam arrangement 102, a first electrode layer 708 of the second support beam element 304 of the support beam arrangement 102, a first electrode layer 710 of the first beam 104 and a first electrode layer 712 of the second beam 106. The first electrode layer 702 of the piezoelectric actuator device 700 may also include a first electrode layer 713 of the coupling beam 108. The second electrode layer 704 of the piezoelectric actuator device 700 may include a second electrode layer 714 of the first support beam element 302 of the support beam arrangement 102, a second electrode layer 716 of the second support beam element 304 of the support beam arrangement 102, a second electrode layer 718 of the first beam 104 and a second electrode layer 720 of the second beam 106. The second electrode layer 704 of the piezoelectric actuator device 700 may include a second electrode layer 721 of the coupling beam 108. The third electrode layer 706 of the piezoelectric actuator device 700 may include a third electrode layer 722 of the first support beam element 302 of the support beam arrangement 102, a third electrode layer 724 of the second support beam element 304 of the support beam arrangement 102, a third electrode layer 726 of the first beam 104 and a third electrode layer 728 of the second beam 106. The third electrode layer 706 of the piezoelectric actuator device 700 may also include a third electrode layer 729 of the coupling beam 108.

The first electrode layer 708 of the second support beam element 304, the first electrode layer 710 of the first beam 104, the first electrode layer 712 of the second beam 106 and the first electrode layer 713 of the coupling beam 108 are electrically connected. The first electrode layer 708 of the second support beam element 304, the first electrode layer 710 of the first beam 104, the first electrode layer 712 of the second beam 106 and the first electrode layer 713 of the coupling beam 108 are isolated from the first electrode layer 706 of the first support beam element 302. The second electrode layer 716 of the second support beam element 304, the second electrode layer 718 of the first beam 104, the second electrode layer 720 of the second beam 106 and the second electrode layer 721 of the coupling beam 108 are electrically connected. The second electrode layer 716 of the second support beam element 304, the second electrode layer 718 of the first beam 104, the second electrode layer 720 of the second beam 106 and the second electrode layer 721 of the coupling beam 108 are isolated from the second electrode layer 714 of the first support beam element 302. The third electrode layer 724 of the second support beam element 304, the third electrode layer 726 of the first beam 104, the third electrode layer 728 of the second beam 106 and the third electrode layer 729 of the coupling beam 108 are electrically connected. The third electrode layer 724 of the second support beam element 304, the third electrode layer 726 of the first beam 104, the third electrode layer 728 of the second beam 106 and the third electrode layer 729 of the coupling beam 108 are isolated from the third electrode layer 722 of the first support beam element 302.

In one embodiment, a bias voltage may be applied on the first electrode layer 706 of the first support beam element 302 while the first electrode layer 708 of the second support beam element 304, the first electrode layer 710 of the first beam 104, the first electrode layer 712 of the second beam 106 and the first electrode layer 713 of the coupling beam 108 may be grounded. A bias voltage may be applied on the second electrode layer 716 of the second support beam element 304, the second electrode layer 718 of the first beam 104, the second electrode layer 720 of the second beam 106 and the second electrode layer 721 of the coupling beam 108 while the second electrode layer 714 of the first support beam element 302 may be grounded. A bias voltage may be applied on the third electrode layer 722 of the first support beam element 302 while the third electrode layer 724 of the second support beam element 304, the third electrode layer 726 of the first beam 104, the third electrode layer 728 of the second beam 106 and the third electrode layer 729 of the coupling beam 108 may be grounded.

In another embodiment, a bias voltage may be applied on the first electrode layer 708 of the second support beam element 304, the first electrode layer 710 of the first beam 104, the first electrode layer 712 of the second beam 106 and the first electrode layer 713 of the coupling beam 108 while the first electrode layer 706 of the first support beam element 302 may be grounded. A bias voltage may be applied on the second electrode layer 714 of the first support beam element 302 while the second electrode layer 716 of the second support beam element 304, the second electrode layer 718 of the first beam 104, the second electrode layer 720 of the second beam 106 and the second electrode layer 721 of the coupling beam 108 may be grounded. A bias voltage may be applied on the third electrode layer 724 of the second support beam element 304, the third electrode layer 726 of the first beam 104, the third electrode layer 728 of the second beam 106 and the third electrode layer 729 of the coupling beam 108 while the third electrode layer 722 of the first support beam element 302 may be grounded.

Therefore, the first electrode layers 706, 708, 710, 712, 713 of the first support beam element 302, the second support beam element 304, the first beam 104, the second beam 106 and the coupling beam 108, and the second electrode layers 714, 716, 718, 720, 721 of the first support beam element 302, the second support beam element 304, the first beam 104, the second beam 106 and the coupling beam 108 may have opposite bias voltage polarity respectively. The second electrode layers 714, 716, 718, 720, 721 of the first support beam element 302, the second support beam element 304, the first beam 104, the second beam 106 and the coupling beam 108, and the third electrode layers 722, 724, 726, 728, 729 of the first support beam element 302, the second support beam element 304, the first beam 104, the second beam 106 and the coupling beam 108 may have opposite bias voltage polarity respectively. The first electrode layers 706, 708, 710, 712, 713 of the first support beam element 302, the second support beam element 304, the first beam 104, the second beam 106 and the coupling beam 108, and the third electrode layers 722, 724, 726, 728, 729 of the first support beam element 302, the second support beam element 304, the first beam 104, the second beam 106 and the coupling beam 108 may have the same bias voltage polarity respectively.

Figure 8A:
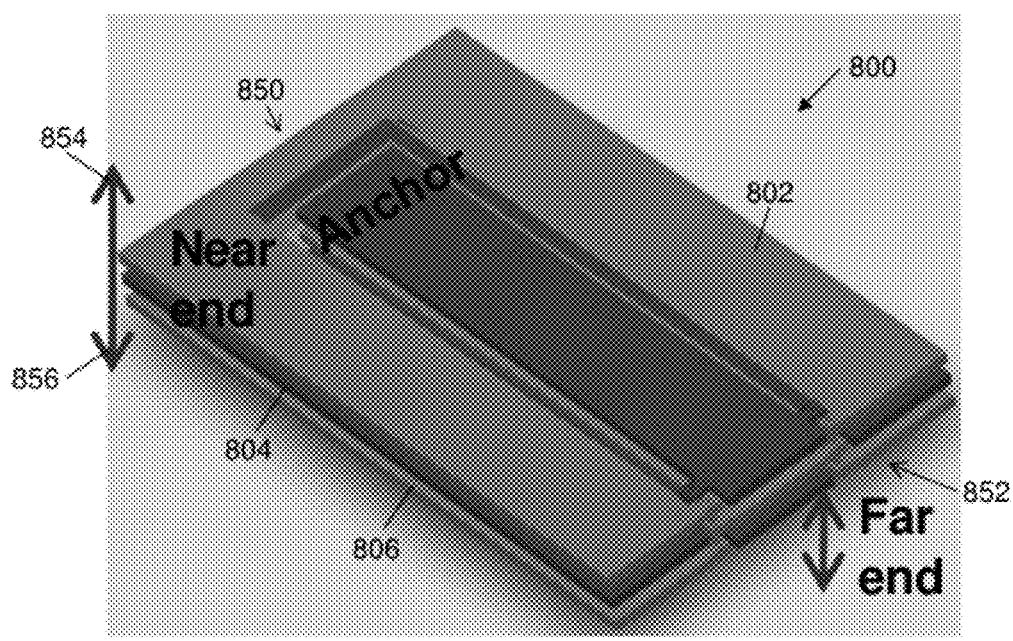
FIG. 8 shows schematic diagrams of a piezoelectric actuator device having a bimorph structure and two-level driving configuration according to one embodiment.
Figure 8:
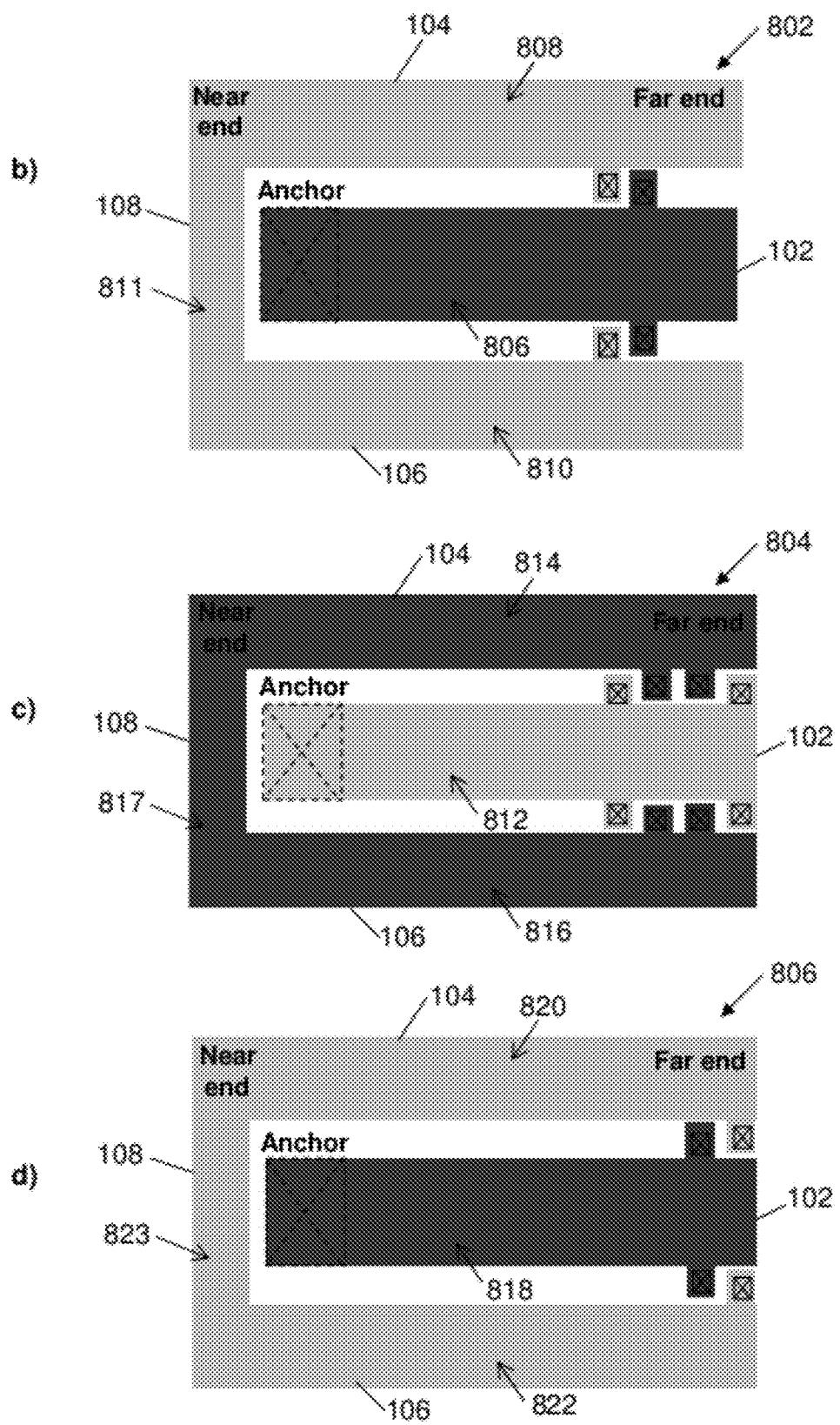

FIG. 8a shows a schematic three-dimensional view of a piezoelectric actuator device 800 having a two-level driving configuration and a bimorph structure. The piezoelectric actuator device 800 has a first electrode layer 802, a second electrode layer 804 and a third electrode layer 806. The piezoelectric actuator device 800 also has a first piezoelectric layer disposed between the first electrode layer 802 and the second electrode layer 804, and a second piezoelectric layer disposed between the second electrode layer 804 and the third electrode layer 806. For simplicity, the first piezoelectric layer and the second piezoelectric layer are not shown in FIG. 8a. The first electrode layer 802, the second electrode layer 804 and the third electrode layer 806 may be electrically isolated from each other.

The piezoelectric actuator device 800 has a near end 850 and a far end 852. Arrows 854, 856 indicate driving directions of the piezoelectric actuator device 800.

FIG. 8b shows a schematic top view of the first electrode layer 802 of the piezoelectric actuator device 800. FIG. 8c shows a schematic top view of the second electrode layer 804 of the piezoelectric actuator device 800. FIG. 8d shows a schematic top view of the third electrode layer 806 of the piezoelectric actuator device 800. The first electrode layer 802 of the piezoelectric actuator device 800 may include a first electrode layer 806 of the support beam arrangement 102, a first electrode layer 808 of the first beam 104 and a first electrode layer 810 of the second beam 106. The first electrode layer 802 of the piezoelectric actuator device 800 may include a first electrode layer 811 of the coupling beam 108. The second electrode layer 804 of the piezoelectric actuator device 800 may include a second electrode layer 812 of the support beam arrangement 102, a second electrode layer 814 of the first beam 104 and a second electrode layer 816 of the second beam 106. The second electrode layer 804 of the piezoelectric actuator device 800 may include a second electrode layer 817 of the coupling beam 108. The third electrode layer 806 of the piezoelectric actuator device 800 may include a third electrode layer 818 of the support beam arrangement 102, a third electrode layer 820 of the first beam 104 and a third electrode layer 822 of the second beam 106. The third electrode layer 806 of the piezoelectric actuator device 800 may include a third electrode layer 823 of the coupling beam 108.

The first electrode layer 808 of the first beam 104, the first electrode layer 810 of the second beam 106 and the first electrode layer 811 of the coupling beam 108 are electrically connected. The first electrode layer 808 of the first beam 104, the first electrode layer 810 of the second beam 106 and the first electrode layer 811 of the coupling beam 108 are isolated from the first electrode layer 806 of the support beam arrangement 102. The second electrode layer 814 of the first beam 104, the second electrode layer 816 of the second beam 106 and the second electrode layer 817 of the coupling beam 108 are electrically connected. The second electrode layer 814 of the first beam 104, the second electrode layer 816 of the second beam 106 and the second electrode layer 817 of the coupling beam 108 are isolated from the second electrode layer 812 of the support beam arrangement 102. The third electrode layer 820 of the first beam 104, the third electrode layer 822 of the second beam 106 and the third electrode layer 823 of the coupling beam 108 are electrically connected. The third electrode layer 820 of the first beam 104, the third electrode layer 822 of the second beam 106 and the third electrode layer 823 of the coupling beam 108 are isolated from the third electrode layer 818 of the support beam arrangement 102.

In one embodiment, a bias voltage may be applied on the first electrode layer 806 of the support beam arrangement 102 while the first electrode layer 808 of the first beam 104, the first electrode layer 810 of the second beam 106 and the first electrode layer 811 of the coupling beam 108 may be grounded. A bias voltage may be applied on the second electrode layer 814 of the first beam 104, the second electrode layer 816 of the second beam 106 and the second electrode layer 817 of the coupling beam 108 while the second electrode layer 812 of the support beam arrangement 102 may be grounded. A bias voltage may be applied on the third electrode layer 818 of the support beam arrangement 102 while the third electrode layer 820 of the first beam 104, the third electrode layer 822 of the second beam 106 and the third electrode layer 823 of the coupling beam 108 may be grounded.

In another embodiment, a bias voltage may be applied on the first electrode layer 808 of the first beam 104, the first electrode layer 810 of the second beam 106 and the first electrode layer 811 of the coupling beam 108 while the first electrode layer 806 of the support beam arrangement 102 may be grounded. A bias voltage may be applied on the second electrode layer 812 of the support beam arrangement 102 while the second electrode layer 814 of the first beam 104, the second electrode layer 816 of the second beam 106 and the second electrode layer 817 of the coupling beam 108 may be grounded. A bias voltage may be applied on the third electrode layer 820 of the first beam 104, the third electrode layer 822 of the second beam 106 and the third electrode layer 823 of the coupling beam 108 while the third electrode layer 818 of the support beam arrangement 102 may be grounded.

Therefore, the first electrode layers 806, 808, 810, 811 of the support beam arrangement 102, the first beam 104, the second beam 106 and the coupling beam 108, and the second electrode layers 812, 814, 816, 817 of the support beam arrangement 102, the first beam 104, the second beam 106 and the coupling beam 108 may have opposite bias voltage polarity respectively. The second electrode layers 812, 814, 816, 817 of the support beam arrangement 102, the first beam 104, the second beam 106 and the coupling beam 108, and the third electrode layers 818, 820, 822, 823 of the support beam arrangement 102, the first beam 104, the second beam 106 and the coupling beam 108 may have opposite bias voltage polarity respectively. The first electrode layers 806, 808, 810, 811 of the support beam arrangement 102, the first beam 104, the second beam 106 and the coupling beam 108, and the third electrode layers 818, 820, 822, 823 of the support beam arrangement 102, the first beam 104, the second beam 106 and the coupling beam 108 may have the same bias voltage polarity respectively.

Figure 9:
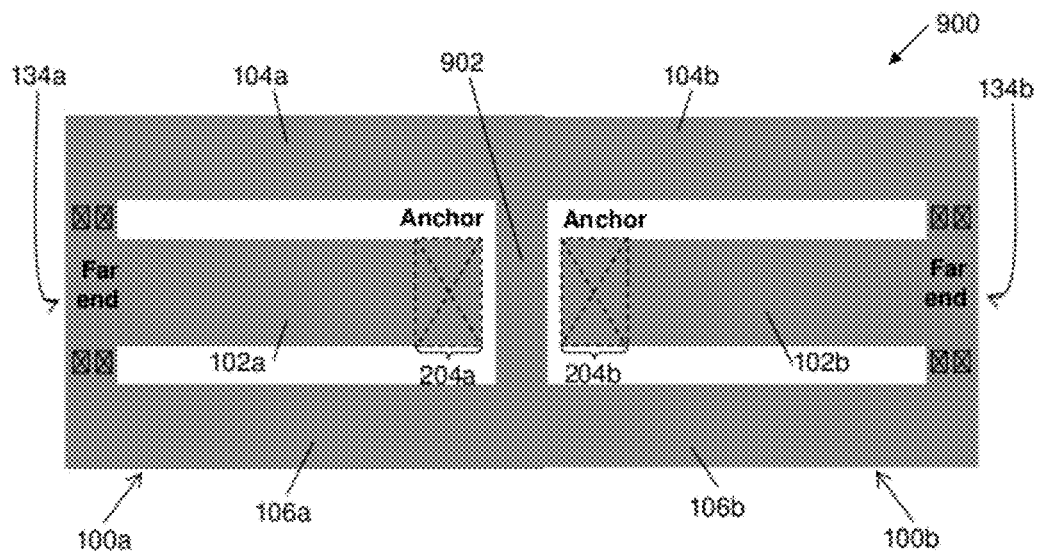
FIG. 9 shows a schematic top view of a piezoelectric actuator device according to one embodiment.

FIG. 9 shows a schematic top view of a piezoelectric actuator device 900. The piezoelectric actuator device 900 includes a combination of two piezoelectric actuator devices 100a, 100b shown in FIG. 1. The two piezoelectric actuator devices 100a, 100b have a common coupling beam 902. The first beam 104a and the second beam 106a of the piezoelectric actuator device 100a and the first beam 104b and the second beam 106b of the piezoelectric actuator device 100b are mechanically fixed to the common coupling beam 902. The piezoelectric actuator device 900 has a two-level driving configuration. The piezoelectric actuator device 900 may have a mono-morph structure, a bimorph structure or a multi-morph structure.

Figure 10:
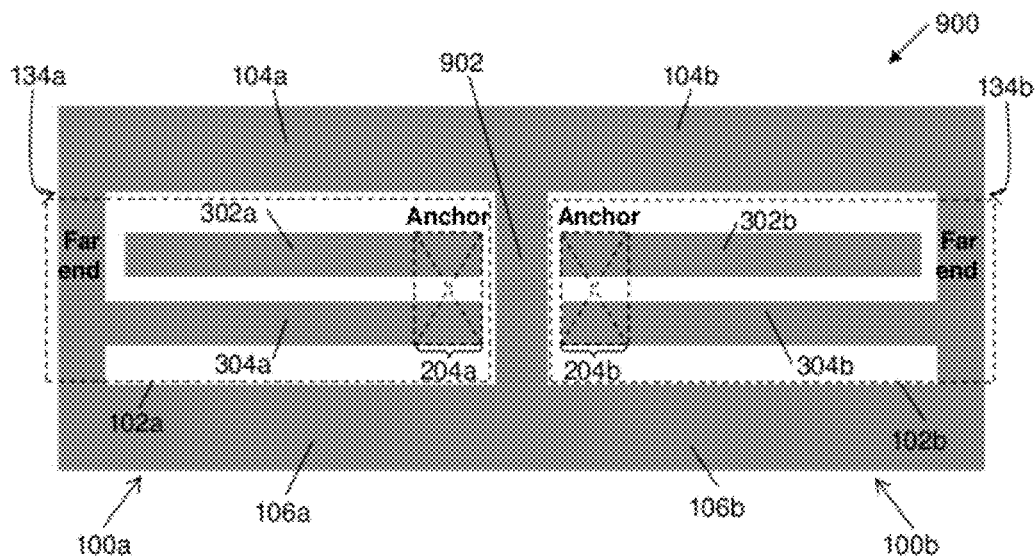
FIG. 10 shows a schematic top view of a piezoelectric actuator device according to one embodiment.

FIG. 10 shows a schematic top view of a piezoelectric actuator device 1000. The piezoelectric actuator device 1000 includes a combination of two piezoelectric actuator devices 300a, 300b shown in FIG. 3. The two piezoelectric actuator devices 300a, 300b have a common coupling beam 1002. The first beam 104a and the second beam 106a of the piezoelectric actuator device 100a and the first beam 104b and the second beam 106b of the piezoelectric actuator device 100b are mechanically fixed to the common coupling beam 1002. The piezoelectric actuator device 1000 has a one-level driving configuration. The piezoelectric actuator device 1000 may have a mono-morph structure, a bimorph structure or a multi-morph structure.

The piezoelectric actuator device 900 and the piezoelectric actuator device 1000 can provide a larger flat area, which is preferred for implementation in e.g. microelectromechanical system (MEMS) tunable capacitors.

Figure 11:
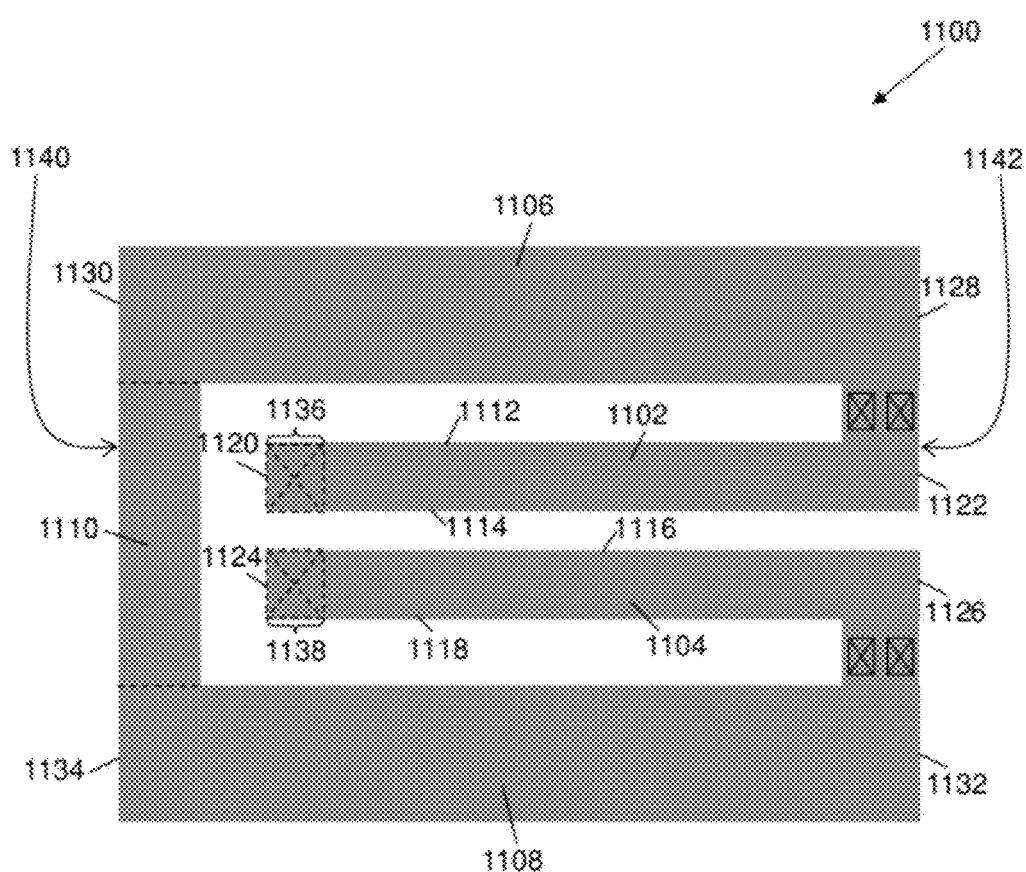
FIG. 11 shows a schematic top view of a piezoelectric actuator device according to one embodiment.

FIG. 11 shows a schematic top view of a piezoelectric actuator device 1100. The piezoelectric actuator device 1100 has a first support beam 1102, a second support beam 1104, a first beam 1106, a second beam 1108 and a coupling beam 1110. The first beam 1106 and the second support beam 1104 are disposed at opposite sides of the first support beam 1102. The first beam 1106 is disposed adjacent a first side 1112 of the first support beam 1102. The second support beam 1104 is disposed adjacent a second side 1114 of the first support beam 1102. The first support beam 1102 and the second beam 1108 are disposed at opposite sides of the second support beam 1104. The first support beam 1102 is disposed adjacent a first side 1116 of the second support beam 1104. The second beam 1108 is disposed adjacent a second side 1118 of the second support beam 1104.

The first support beam 1102 has a first end 1120 and a second end 1122. The first support beam 1102 extends from its first end 1120 to its second end 1122. The second support beam 1104 has a first end 1124 and a second end 1126. The second support beam 1104 extends from the first end 1124 to its second end 1126. The first beam 1106 has a first end 1128 and a second end 1130. The second beam 1108 has a first end 1132 and a second end 1134.

The first end 1128 of the first beam 1106 is mechanically fixed to the second end 1122 of the first support beam 1102. The first end 1132 of the second beam 1108 is mechanically fixed to the second end 1126 of the second support beam 1104. The coupling beam 1110 is mechanically coupled to the second end 1130 of the first beam 1106 and the second end 1134 of the second beam 1108. The first end 1120 of the first support beam 1102 is mechanically fixed to a first anchor region 1136. The first end 1124 of the second support beam 1104 is mechanically fixed to a second anchor region 1138.

The first beam 1106 and the second beam 1108 are arranged such that the first end 1120 of the first support beam 1102 is located between the coupling beam 1110 and the second end 1122 of the first support beam 1102 and such that the first end 1124 of the second support beam 1104 is between the coupling beam 1110 and the second end 1126 of the second support beam 1104.

The piezoelectric actuator device 1100 has a near end 1140 and a far end 1142. In one embodiment, the piezoelectric actuator device 1100 is an M-shape actuator.

Figure 12:
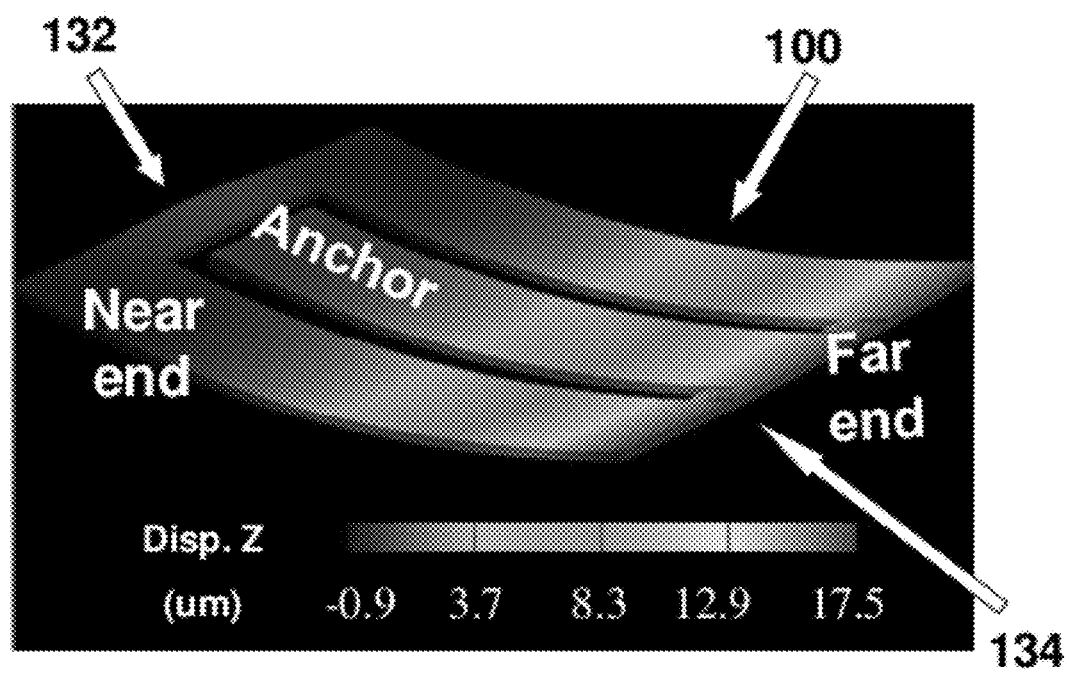
FIG. 12 shows a simulated initial deformation of a piezoelectric actuator device due to residual stress according to one embodiment.

FIG. 12 shows a simulated initial deformation of the piezoelectric actuator device 100 due to residual stress of thin films. The piezoelectric actuator device 100 may have a mono-morph structure. The simulation shows that the near end 132 of the piezoelectric actuator device 100 curls down about 0.9 μm, and the far end 134 of the piezoelectric actuator device 100 curls up about 17.5 μm. The far end 134 curls up with large initial deflection, but the near end 132 deforms with much smaller initial deflection. Therefore, using the near end 132 as the actuation/action end can reduce the residual stress effect on the performance of the piezoelectric actuator device 100.

Figure 13:
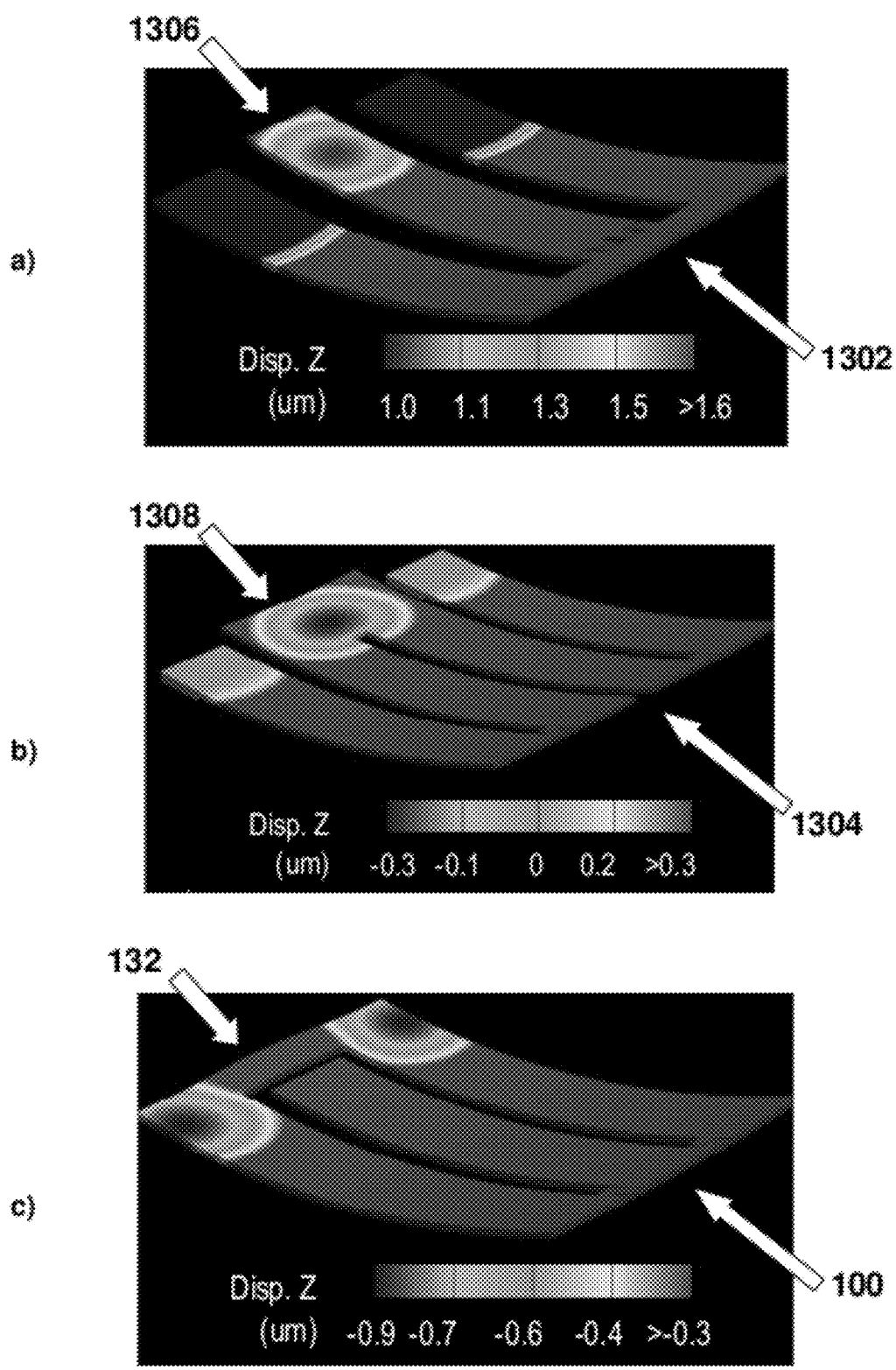
FIG. 13 shows simulation results of two conventional actuators and simulation results of a piezoelectric actuator device according to one embodiment.

FIG. 13 compares simulated deflection due to the residual stress between a conventional folded actuator 1302 [1-2], a conventional W-shape actuator 1304 [3-5] and the piezoelectric actuator device 100. FIG. 13a shows simulation results of the conventional folded actuator 1302. FIG. 13b shows simulation results of the conventional W-shape actuator 1304. FIG. 13c shows simulation results of the piezoelectric actuator device 100. For the simulation, the piezoelectric actuator device 100 having a mono-morph structure and a two-level driving configuration (e.g. the piezoelectric actuator device 500) may be used. The piezoelectric actuator device 100 may have a first electrode layer 402 of about 0.4 μm thick, a piezoelectric layer 406 of about 0.5 μm thick and a second electrode layer 404 of about 0.3 μm thick. A stress of about −60 MPa may be applied on the first electrode layer 402, a stress of about 50 MPa may be applied on the piezoelectric layer 406, a stress of about −55 MPa may be applied on the second electrode layer 404.

From the simulation results, the conventional folded actuator 1302 has an initial deflection of about 1.0 μm at a near end 1306. The conventional W-shape actuator 1304 has an initial deflection of about −0.3 μm at a near end 1308. The piezoelectric actuator device 100 has an initial deflection of about −0.9 μm at the near end 132. A negative displacement value indicates that the near end curls downwards, and a positive displacement value indicates that the near end curls upwards. The piezoelectric actuator device 100 has larger initial deflection at the near end 132 as compared to the conventional W-shape actuator 1304. The initial deflection at the near end 132 of the piezoelectric actuator device 100 and the initial deflection at the near end 1306 of the conventional folded actuator 1302 are close.

When a 20 V bias voltage is applied, the conventional folded actuator 1302 has a displacement of about 3.3 μm at the near end 1306, the conventional W-shape actuator 1304 has a displacement of about 4.7 μm at the near end 1308, and the piezoelectric actuator device 100 has a displacement of about 5.0 μm at the near end 132. The piezoelectric actuator device 100 has a displacement at the near end 132 as compared to the conventional folded actuator 1302 and the conventional W-shape actuator 1304. Further, the conventional folded actuator 1302 has a flat area of about 4225 μm$^2$ at the near end 1306 and a footprint area of about 133000 μm$^2$. The conventional W-shape actuator 1304 has a flat area of about 4500 μm$^2$ at the near end 1308 and a footprint area of about 180500 μm$^2$. The piezoelectric actuator device 100 has a flat area of about 8400 μm$^2$ at the near end 132 and a footprint area of about 133000 μm$^2$.

FIGS. 14a to 14c show simulations results of the conventional folded actuator 1302, the conventional W-shape actuator 1304 and the piezoelectric actuator device 100 respectively. For the simulation, the piezoelectric actuator device 100 having a mono-morph structure and a two-level driving (e.g. the piezoelectric actuator device 600) may be used. The piezoelectric actuator device 100 may have a first electrode layer 402 of about 0.4 μm thick, a piezoelectric layer 406 of about 0.5 μm thick and a second electrode layer 404 of about 0.3 μm thick. A stress of about −60 MPa may be applied on the first electrode layer 402, a stress of about 80 MPa may be applied on the piezoelectric layer 406, a stress of about −55 MPa may be applied on the second electrode layer 404.

From the simulation results, the conventional folded actuator 1302 has a displacement of about 1.4 μm at the near end 1306. The conventional W-shape actuator 1304 has a displacement of about −0.2 μm at the near end 1308. The piezoelectric actuator device 100 has a displacement of about −1.0 μm at the near end 132. Further, the conventional folded actuator 1302 has a flat area of about 5625 μm$^2$ at the near end 1306. The conventional W-shape actuator 1304 has a flat area of about 4500 μm$^2$ at the near end 1308. The piezoelectric actuator device 100 has a flat area of about 8400 μm$^2$ at the near end 132.

Comparing the simulation results of the conventional folded actuator 1302 and the piezoelectric actuator device 100 (FIGS. 13a and 13c, and FIGS. 14a and 14c), deformation variation caused by the residual stress can be reduced by more than 75%, the flat area at the near end 132 can be increased by about 50% and the displacement at the near end 132 can be increased by about 57.5% for the piezoelectric actuator device 100.

Comparing the simulation results of the conventional W-shape actuator 1304 and the piezoelectric actuator device 100 (FIGS. 13b and 13c, and FIGS. 14b and 14c), deformation variation caused by the residual stress is comparable, the flat area at the near end 132 can be increased by about 86.6%, the displacement at the near end 132 is comparable, and the footprint area can be reduced by about 35.7% for the piezoelectric actuator device 100.

Figure 14:
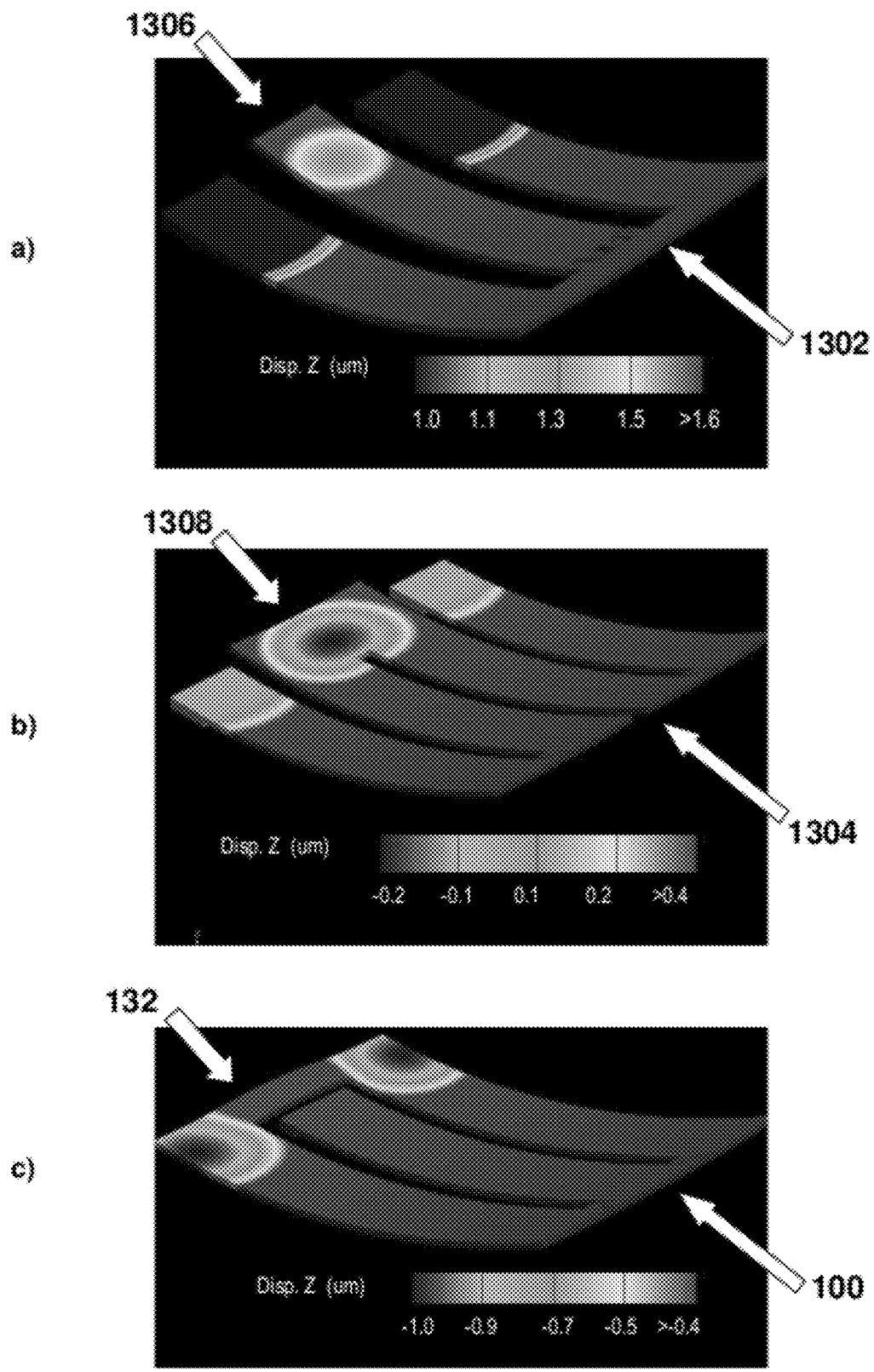
FIG. 14 shows simulation results of two conventional actuators and simulation results of a piezoelectric actuator device according to one embodiment.

Based on the simulation results from FIGS. 13 and 14, the piezoelectric actuator device 100 has comparable initial deflection at the near end 132 and has a much larger flat area than the two conventional actuators 1302, 1304. This can be favorable to e.g. MEMS tunable capacitors or MEMS capacitive switches, which need large flat area for contact. Further, the piezoelectric actuator device 100 is also less sensitive to residual stress as compared to the two conventional actuators 1302, 1304.

Figure 15A:
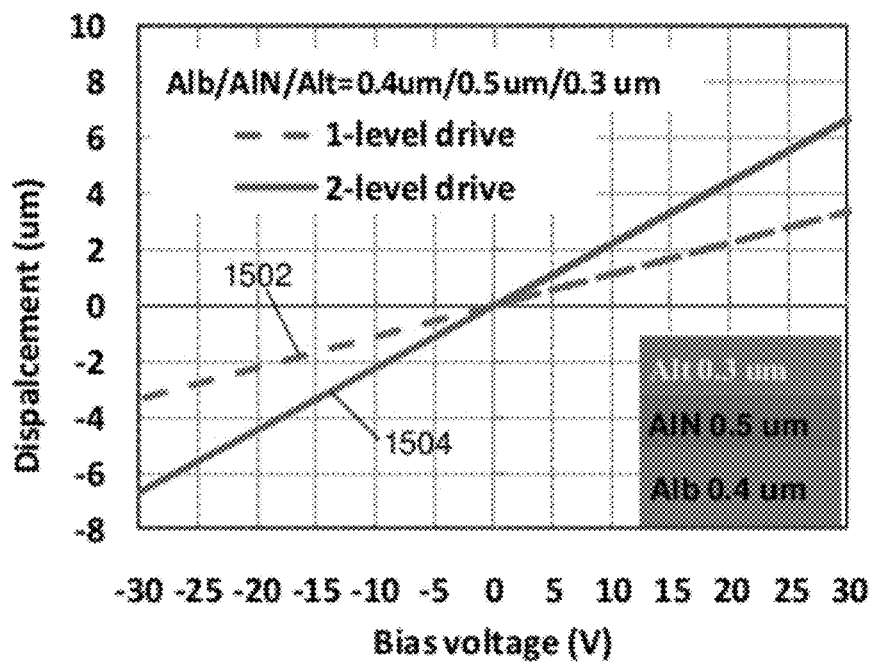
FIG. 15a shows calculated displacement at a near end as a function of a bias voltage for a piezoelectric actuator device having a mono-morph structure according to one embodiment.

FIG. 15a shows calculated displacement at a near end 132 as a function of a bias voltage for a piezoelectric actuator device 100 having a mono-morph structure. In one embodiment, the piezoelectric actuator device 100 may have a first electrode layer 402 of about 0.4 µm thick, a piezoelectric layer 406 of about 0.5 µm thick and a second electrode layer 404 of about 0.3 µm thick. Graph 1502 shows the calculated displacement at the near end 132 plotted against the bias voltage for the piezoelectric actuator device 100 having a mono-morph structure and a one-level driving configuration (e.g. the piezoelectric actuator device 500). Graph 1504 shows the calculated displacement at the near end 132 plotted against the bias voltage for the piezoelectric actuator device 100 having a mono-morph structure and a two-level driving configuration (e.g. the piezoelectric actuator device 600).

Figure 15B:
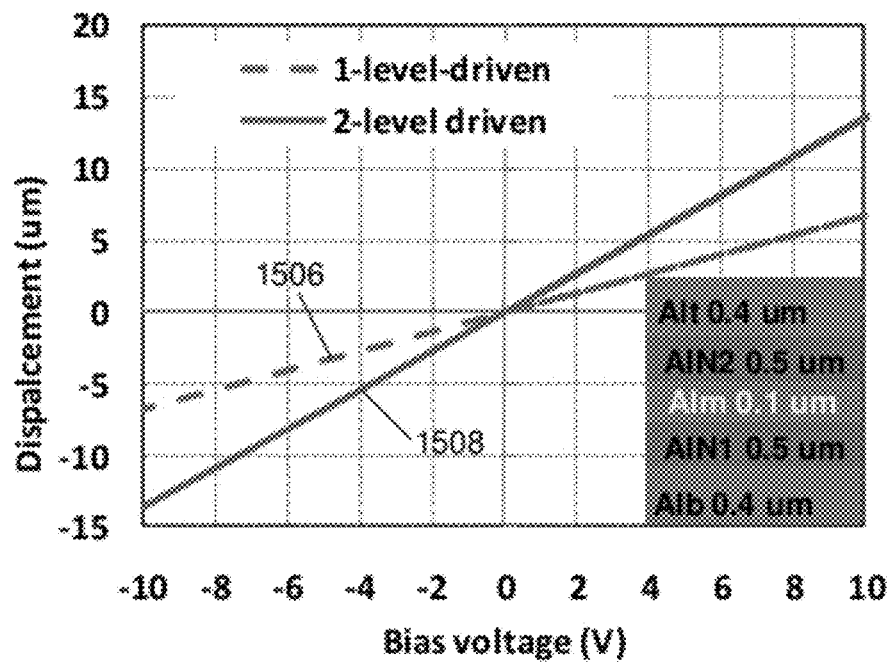
FIG. 15b shows calculated displacement at a near end as a function of a bias voltage for a piezoelectric actuator device having a mono-morph structure according to one embodiment.

FIG. 15b shows calculated displacement at a near end 132 as a function of a bias voltage for a piezoelectric actuator device 100 having a bimorph structure. In one embodiment, the piezoelectric actuator device 100 may have a first electrode layer 408 of about 0.4 µm thick, a first piezoelectric layer 414 of about 0.5 µm thick, a second electrode layer 410 of about 0.1 µm thick, a second piezoelectric layer 416 of about 0.5 µm thick, and a third electrode layer 412 of about 0.4 µm thick. Graph 1506 shows the calculated displacement at the near end 132 plotted against the bias voltage for the piezoelectric actuator device 100 having a bimorph structure and a one-level driving configuration (e.g. the piezoelectric actuator device 700). Graph 1508 shows the calculated displacement at the near end 132 plotted against the bias voltage for the piezoelectric actuator device 100 having a bimorph structure and a two-level driving configuration (e.g. the piezoelectric actuator device 800).

Comparing graphs 1502, 1504 with graphs 1506, 1508, it can be observed that the displacement of the piezoelectric actuator device 100 having a bimorph structure is larger than the piezoelectric actuator device 100 having a mono-morph structure. Comparing graph 1502 with graph 1504 and comparing graph 1506 with graph 1508, it can be observed that the displacement of the piezoelectric actuator device 100 having a two-level driving configuration is larger than the piezoelectric actuator device 100 having a one-level driving configuration.

Figure 16A:
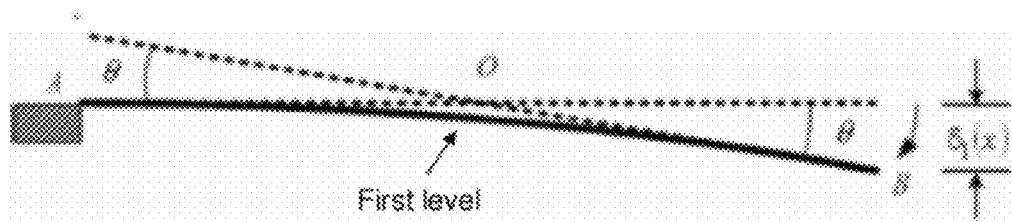
FIG. 16a shows displacement at a near end of a one-level driving piezoelectric actuator device according to one embodiment.
Figure 16B:
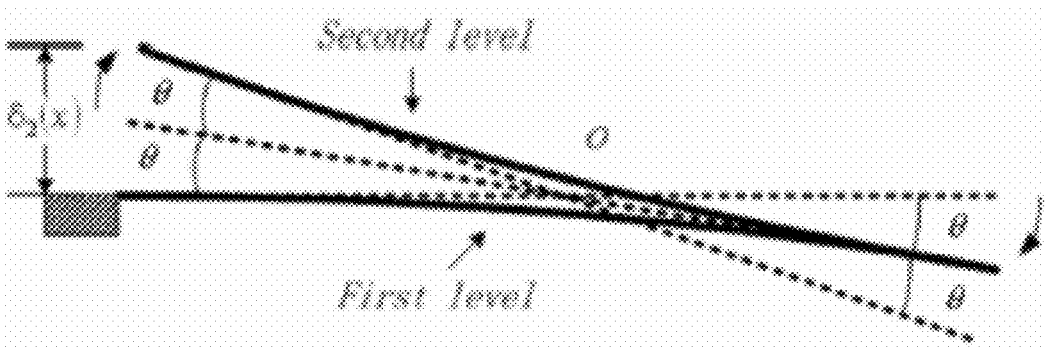
FIG. 16b shows displacement at a near end of a two-level driving piezoelectric actuator device according to one embodiment.

Further, FIG. 16a shows the displacement $\delta_1$ at a near end 132 of the piezoelectric actuator device 100 having a one-level driving configuration. FIG. 16b shows the displacement $\delta_2$ at a near end of the piezoelectric actuator device 100 having a two-level driving configuration. It can be observed that the displacement at the near end of the piezoelectric actuator device 100 having a two-level driving configuration is nearly 2 times of that of the piezoelectric actuator device 100 having a one-level driving configuration.

Therefore, the piezoelectric actuator device 100 having a bimorph structure and a two-level driving configuration can provide the largest displacement (see graph 1508 of FIG. 15b). The fabrication process for the piezoelectric actuator device 100 having a bimorph structure and a two-level driving configuration may be the most complicated as the piezoelectric actuator device 100 having a bimorph structure and a two-level driving configuration includes two layers of piezoelectric material and three layers of metal (e.g. two piezoelectric layers and three electrode layers) and vias are needed to connect the metal layers for potential transition.

The displacement for the piezoelectric actuator device 100 having a mono-morph structure and a one-level driving configuration is the smallest (see graph 1502 of FIG. 15a). However, the fabrication process for the piezoelectric actuator device 100 having a mono-morph structure and a one-level driving configuration is simple as the piezoelectric actuator device 100 having a mono-morph structure and a one-level driving configuration includes one layer of piezoelectric material and two layers of metal (e.g. one piezoelectric layers and two electrode layers) and does not need vias for potential transition.

FIG. 17 shows simulation results of the piezoelectric actuator device 1100. In one embodiment, the piezoelectric actuator device 1100 may have a first electrode layer of about 0.4 µm thick, a piezoelectric layer of about 0.5 µm thick and a second electrode layer of about 0.3 µm thick. A stress of about −60 MPa may be applied on the first electrode layer, a stress of about 50 MPa may be applied on the piezoelectric layer, a stress of about −55 MPa may be applied on the second electrode layer.

Figure 17A:
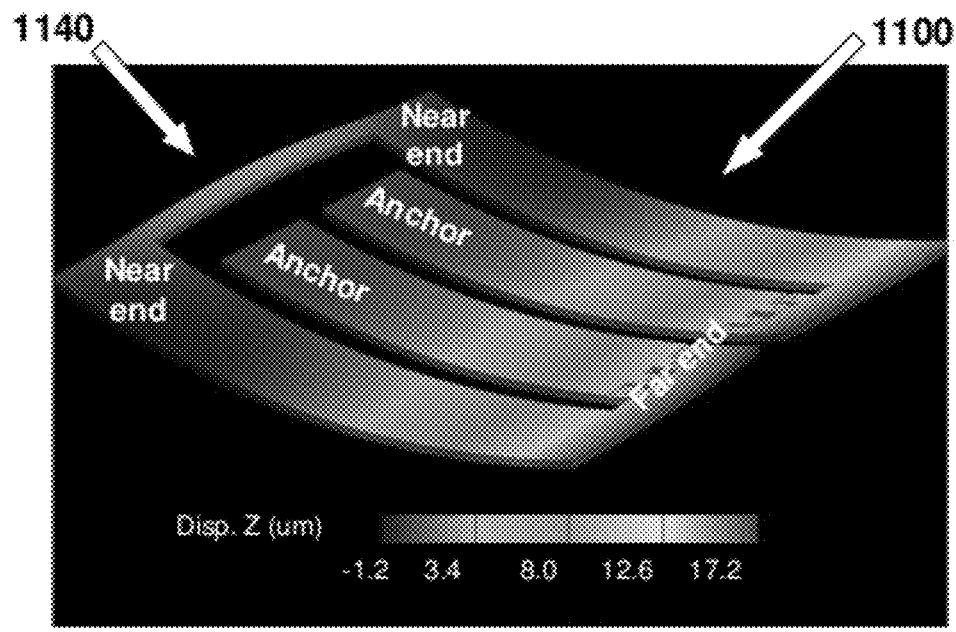
FIG. 17 shows simulation results of a piezoelectric actuator device according to one embodiment.
Figure 17B:
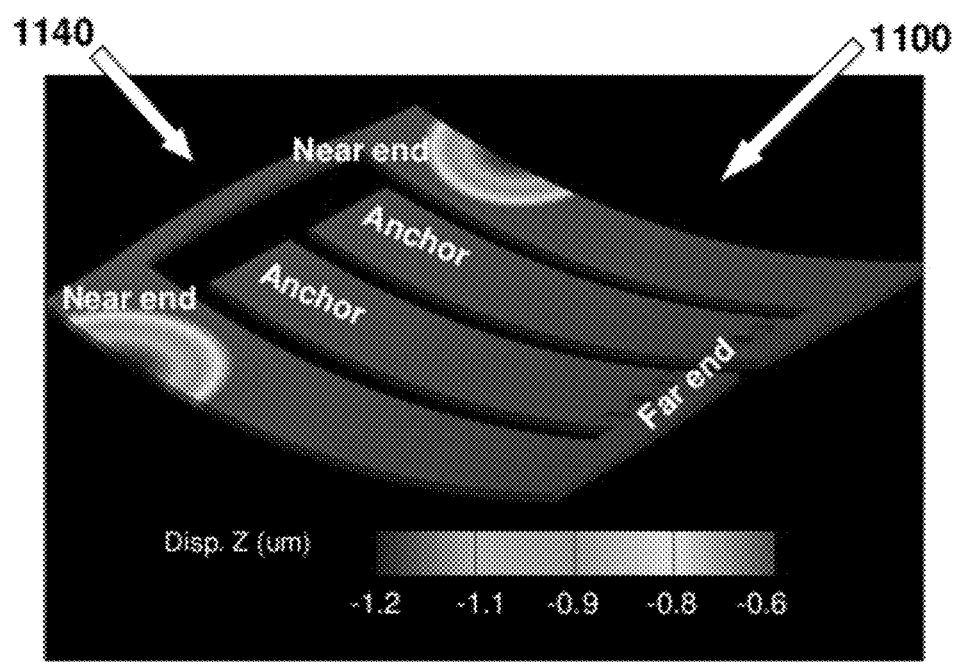

FIG. 17a shows a full displacement scale (−1.2 µm to 17.2 µm) for an initial deflection of the piezoelectric actuator device 1100 at the near end 1140. FIG. 17b shows a partial displacement scale (−1.2 µm to −0.6 µm) for the initial deflection of the piezoelectric actuator device 1100 at the near end 1140. FIG. 17a and FIG. 17b show that the initial deflection at the near end 1140 of the piezoelectric actuator device 1100 is about −1.2 µm. The piezoelectric actuator device 1100 has a flat area of about 8400 µm² at the near end 1140.

Figure 17C:
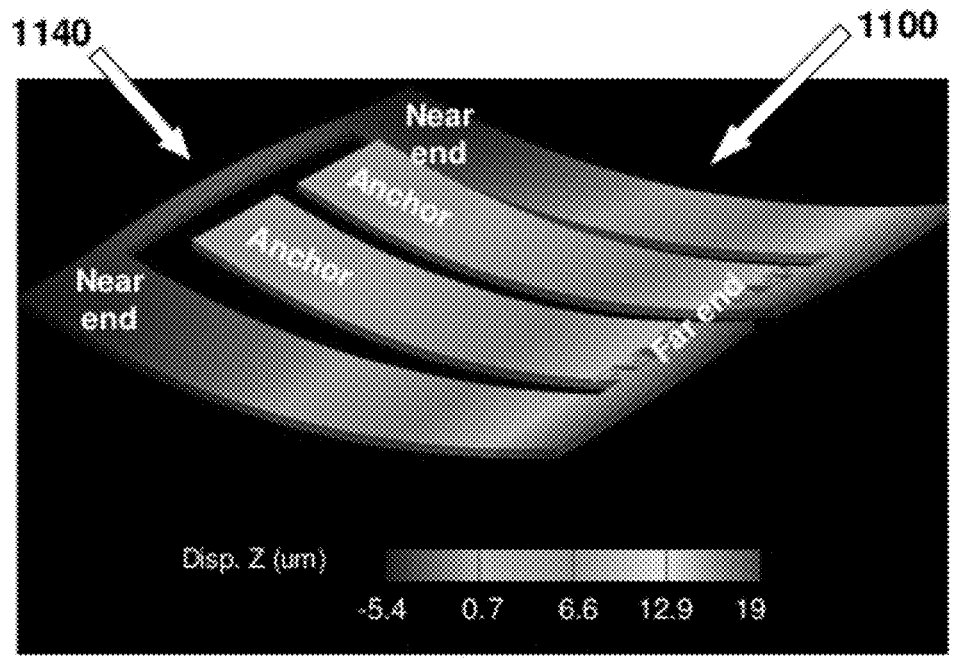
Figure 17D:
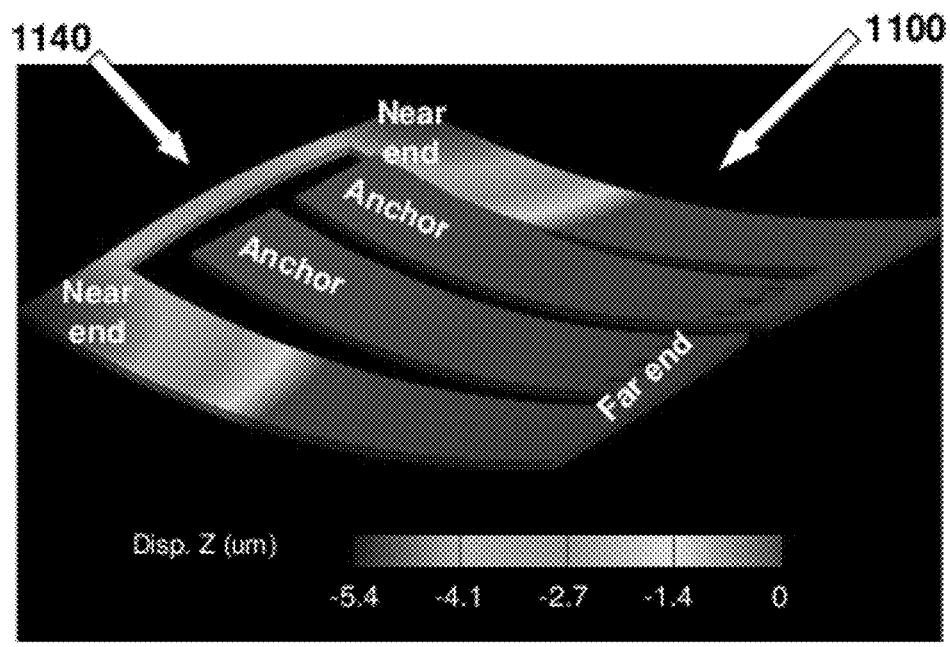

FIG. 17c shows a full displacement scale (−5.4 µm to 19 µm) for a displacement of the piezoelectric actuator device 1100 at the near end 1140 when a 20 V bias voltage is applied. FIG. 17d shows a partial displacement scale (−5.4 µm to 0 µm) for the displacement of the piezoelectric actuator device 1100 at the near end 1140 when a 20 V bias voltage is applied. FIGS. 17c and 17d show that displacement at the near end 1140 of the piezoelectric actuator device 1100 is about 4.2 µm.

In one embodiment, the piezoelectric actuator device may have two folded beam structures (e.g. first beam 104 and second beam 106 (backward beams)) disposed in a line-symmetric manner and may have one forward beam (e.g. support beam arrangement 102). The two beam structures may share an anchor and a forward beam. The two beam structures may be connected to each other at the respective near ends. The near ends act as the action end. The piezoelectric actuator device may have multiple layers of thin film. The multiple layers of thin film may include metal and piezoelectric material. The piezoelectric actuator device may be configured as one-level driving or two-level driving. The piezoelectric actuator device may be configured as two-level driving to increase the displacement by about 100% as compared to one-level driving.

The piezoelectric actuator device as described above can suppress the curling phenomena caused by the residual stress of thin film structures so that the distance between the action end and the fix electrode (e.g. the bottom electrode/contact portion 206) on the substrate can be kept nearly constant regardless of whether the residual strain is large or small. As such, the reproducibility and the reliability of the piezoelectric actuator device can be improved. The piezoelectric actuator device has small initial deformation, large flat area at the action end, a large displacement with the driving voltage and a small footprint. The piezoelectric actuator device can be less sensitive to residual stress. The device yield of the piezoelectric actuator device can be increased. The piezoelectric actuator device can be used for e.g. MEMS switches, tunable capacitors and mirrors.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In this document, the following documents are cited:

[1] Takashi Kawakubo, Toshihiko Nagano, Kazuhide Abe, Michihiko Nishigaki, "Piezoelectric actuator and microelectromechanical device," US 2006/0055287 A1, 16 Mar. 2006.
[2] H. Fang, L. Liu, and T. Ren, "Modeling and design optimization of large-deflection piezoelectric folded cantilever microactuators," IEEE Trans. Ultrasonics, Ferroelectrics, and Frequency Control, vol. 53, no. 1, pp. 237-240, January 2006.
[3] Takashi Kawakubo, Toshihiko Nagano, Michihiko Nishigaki, "Piezoelectric driven MEMS device," U.S. Pat. No. 7,619,349 B2, Nov. 17, 2009.
[4] Takashi Kawakubo, Toshihiko Nagano, Michihiko Nishigaki, "MEMS variable capacitor," US 2009/0296308 A1, Dec. 3, 2009.
[5] Tamio Ikehashi, "Semiconductor device using piezoelectric actuator formed by use of MEMS technique," U.S. Pat. No. 7,446,457 B2, Date Nov. 4, 2008.

What is claimed is:

1. A piezoelectric actuator device, comprising:
   a substrate comprising an anchor region;
   a support beam arrangement having a first end and a second end, wherein the first end is mechanically fixed to the anchor region, the support beam arrangement extends from its first end to its second end and the second end is freely suspended;
   a first beam having a first end and a second end, wherein the first end of the first beam is mechanically fixed to at least a part of the second end of the support beam arrangement and the second end of the first beam is freely suspended;
   a second beam having a first end and a second end, wherein the first end of the second beam is mechanically fixed to at least a part of the second end of the support beam arrangement and the second end of the second beam is freely suspended;
   a coupling beam mechanically coupling the second end of the first beam and the second end of the second beam;
   wherein the first beam and the second beam are arranged such that the first end of the support beam arrangement is located between the coupling beam and the second end of the support beam arrangement.

2. The piezoelectric actuator device of claim 1, wherein the support beam arrangement, the first beam, and the second beam are arranged such that the second end of the first beam is nearer to the anchor region than the first end of the first beam and such that the second end of the second beam is nearer to the anchor region than the first end of the second beam.

3. The piezoelectric actuator device of claim 1, wherein the first beam and the second beam are arranged at opposite sides of the support beam arrangement.

4. The piezoelectric actuator device of claim 1, wherein the support beam arrangement comprises two support beam elements which are electrically isolated from each other and both extend from the first end to the other end.

5. The piezoelectric actuator device of claim 4, wherein the two support beam elements are each electrically conductive.

6. The piezoelectric actuator device of claim 1, wherein the support beam arrangement, the first beam, and the second beam each comprise at least one piezoelectric layer.

7. The piezoelectric actuator device of claim 6, wherein the support beam arrangement, the first beam, and the second beam each comprise at least a first electrode layer and a second electrode layer, and the at least one piezoelectric layer is arranged between the first electrode layer and the second electrode layer.

8. The piezoelectric actuator device of claim 7, wherein the first electrode layer and the second electrode layer are electrically isolated from each other.

9. The piezoelectric actuator device of claim 7, wherein the first electrode layer of the first beam and the first electrode layer of the second beam are electrically connected.

10. The piezoelectric actuator device of claim 7, wherein the second electrode layer of the first beam and the second electrode layer of the second beam are electrically connected.

11. The piezoelectric actuator device of claim 7, wherein the first electrode layer of the first beam and the first electrode layer of the second beam are isolated from the first electrode layer of the support beam arrangement.

12. The piezoelectric actuator device of claim 7, wherein the second electrode layer of the first beam and the second electrode layer of the second beam are isolated from the second electrode layer of the support beam arrangement.

13. The piezoelectric actuator device of claim 1, wherein the support beam arrangement, the first beam, and the second beam each comprise a plurality of piezoelectric layers and a multiplicity of electrode layers arranged such that each piezoelectric layer is surrounded by two electrode layers.

14. The piezoelectric actuator device of claim 1, wherein the substrate further comprises a bottom electrode arranged below at least one of the second end of the first beam and the second end of the second beam.

15. The piezoelectric actuator device of claim 1, wherein the support beam arrangement comprises at least one support beam.

* * * * *